(12) United States Patent
Kootstra

(10) Patent No.: US 6,880,056 B2
(45) Date of Patent: Apr. 12, 2005

(54) MEMORY ARRAY AND METHOD WITH SIMULTANEOUS READ/WRITE CAPABILITY

(75) Inventor: Lewis Stephen Kootstra, Roseville, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 123 days.

(21) Appl. No.: 10/109,258

(22) Filed: Mar. 28, 2002

(65) Prior Publication Data

US 2003/0188088 A1 Oct. 2, 2003

(51) Int. Cl.$^7$ .............................................. G06F 12/00
(52) U.S. Cl. ................... 711/168; 711/150; 365/189.04
(58) Field of Search ................................ 711/168, 149, 711/150; 365/185.33, 189.04, 219, 222, 230.03–230.05

(56) References Cited

U.S. PATENT DOCUMENTS

| | | | |
|---|---|---|---|
| 4,491,937 A | | 1/1985 | Chan ........................... 365/154 |
| 4,535,427 A | | 8/1985 | Jiang ........................... 365/205 |
| 4,613,958 A | | 9/1986 | Culican et al. ........ 365/189.08 |
| 4,718,003 A | | 1/1988 | Andersen et al. ........... 709/214 |
| 4,888,741 A | * | 12/1989 | Malinowski ........... 365/230.05 |
| 4,999,814 A | * | 3/1991 | Hashimoto ................... 365/222 |
| 5,307,314 A | * | 4/1994 | Lee ........................ 365/189.04 |
| 5,847,998 A | * | 12/1998 | Van Buskirk .......... 365/185.33 |
| 6,072,741 A | * | 6/2000 | Taylor ........................ 365/219 |
| 6,104,663 A | * | 8/2000 | Kablanian ............. 365/230.05 |
| 6,122,216 A | | 9/2000 | Dykes ................... 365/230.03 |
| 6,144,604 A | | 11/2000 | Haller et al. ................ 365/221 |
| 6,173,367 B1 | | 1/2001 | Aleksic et al. .............. 711/129 |
| 6,269,451 B1 | | 7/2001 | Mullarkey .................. 713/401 |
| 6,275,423 B1 | | 8/2001 | Edo ....................... 365/189.07 |
| 6,308,248 B1 | | 10/2001 | Welker et al. .............. 711/209 |
| 6,327,196 B1 | | 12/2001 | Mullarkey .................. 365/194 |
| 6,430,103 B2 | * | 8/2002 | Nakayama et al. .... 365/230.03 |

* cited by examiner

*Primary Examiner*—Nasser Moazzami

(57) ABSTRACT

A memory device includes a plurality of memory arrays, each memory array being coupled to an input data bus and an output data bus, a clock generator that generates an internal clock signal to form at least one transfer cycle to control timing of data transfer to and from the plurality of memory arrays, and a controller that controls read and write operations from and to the plurality of memory arrays. In one embodiment, the controller receives a command word containing at least a first command and a second command and executes the first and second command on the same transfer cycle.

29 Claims, 20 Drawing Sheets

DRAM Block Diagram

|     |       154       |       156       | 158         | 160       | 150 |
|-----|-----------------|-----------------|-------------|-----------|-----|

Command Word

| Cycle | Bank Cmd 1 | Bank Cmd 0 | Write Cmd | Read Cmd | Comment |
|---|---|---|---|---|---|
| 1 | LD[b=0,c=a, p=0] | SM[b=1,c=a, p=1] | - | - | Load bank 0, page 0 into cache 0a<br>Sample (load and write back) bank1, page 0 into cache 1a |
| 2 | LD[b=2,c=a, p=0] | SM[b=3,c=a, p=0] | - | - | Load bank 2, page 0 into cache 2a<br>Sample (load and write back) bank3, page 0 into cache 3a |
| 3 | LD[b=4,c=a, p=0] | SM[b=5,c=a, p=7] | - | - | Load bank 4, page 0 into cache 4a<br>Sample (refresh) bank5, page 7 into cache 5a |
| 4 | | - | WR[b=0,c=a, m=fff,l=0] | RD[b=1,c=a, l=c] | caches 0a and 1a now loaded<br>Reading line c from cache 1a<br>Writing line 0 of cache 0a |
| 5 | | - | WR[b=0,c=a, m=fff,l=1] | RD[b=3,c=a, l=0] | caches 2a and 3a now loaded<br>Reading line 0 from cache 3a<br>Writing line 1 of cache 0a |
| 6 | SV[b=0,c=a, p=0] | - | WR[b=2,c=a, m=fff,l=5] | RD[b=1,c=a, l=d] | Caches 4a and 5a now loaded<br>Saving cache 0a to bank 0, page 0<br>Reading line d from cache 1a<br>Writing line 5 of cache 2a |
| 7 | - | SM[b=1,c=b, p=2] | WR[b=2,c=a, m=fff,l=1] | RD[b=3,c=a, l=5] | Sample of bank 1 complete<br>Reading line 5 from cache 3a<br>Sample (load and write back) bank 1, page 2 into cache 1b<br>Writing line 1 of cache 2a |
| 8 | SV[b=2,c=a, p=0] | - | WR[b=4,c=a, m=fff,l=1] | RD[b=1,c=a, l=e] | Sample of bank 3 complete<br>Beginning save of Bank 2<br>Reading line e from cache 1a<br>Writing line 1 of cache 4a |
| 9 | | - | WR[b=4,c=a, m=fff,l=2] | RD[b=1,c=a, l=f] | Refresh of bank 5 page 7 complete<br>Save of Bank 0 complete<br>Reading line f from cache 1a<br>Writing line 2 of cache 4a |
| 10 | | - | WR[b=4,c=a, m=fff,l=0] | RD[b=1,c=b, l=0] | Read from cycle 4 now valid in ASIC cache 1b now loaded<br>Reading line 0 from cache 1b<br>Writing line 0 of cache 4a |
| 11 | SV[b=4,c=a, p=0] | - | | RD[b=1,c=b, l=1] | Read fromcycle 5 now valid in ASIC<br>Save of bank 2 complete<br>Beginning save of bank 4<br>Reading line 1 from cache 1b |
| 12 | - | - | | - | Read from cycle 6 now valid in ASIC |
| 13 | - | - | | - | Read from cycle 7 now valid in ASIC |
| 14 | - | - | | - | Read from cycle 8 now valid in ASIC<br>Sample of bank 1 complete<br>Save of bank 4 complete |
| 15 | - | - | | - | Read from cycle 9 now valid in ASIC |
| 16 | - | - | | - | Read from cycle 10 now valid in ASIC |
| 17 | - | - | | - | Read from cycle 11 now valid in ASIC |

Fig. 10

Status Register 400

| [7:3] | [2] | [1] | [0] |
|---|---|---|---|
| Reserved | bcmdA_busy_err | bcmdB_busy_err | bank_conflict_err |

Conflict Error Register 410

| [7:4] | [3:2] | [1:0] |
|---|---|---|
| Bank | requested_operation | operation_in_progress |

Fig. 14

Access Timing Register 420

| [7:6] | [5:3] | [2:0] |
|---|---|---|
| - | SAVE Timing | LOAD Timing |
| reserved | 001 ==> 1 cycle<br>010 ==> 2 cycles<br>011 ==> 3 cycles<br>000 ==> 4 cycles<br>101 ==> 5 cycles<br>110 ==> 6 cycles<br>111 ==> 7 cycles<br>100 ==> 8 cycles | 001 ==> 1 cycle<br>010 ==> 2 cycles<br>011 ==> 3 cycles<br>000 ==> 4 cycles<br>101 ==> 5 cycles<br>110 ==> 6 cycles<br>111 ==> 7 cycles<br>100 ==> 8 cycles |

Fig. 15

Capabilities Register 430

| [7:4] | [3:0] |
|---|---|
| LOAD/SAVE times | Maximum Clock Period |
| 0 ==> 47.5nS<br>1 ==> 45.0nS<br>2 ==> 42.5nS<br>3 ==> 40.0nS<br>4 ==> 37.5nS<br>5 ==> 35.0nS<br>6 ==> 32.5nS<br>7 ==> 30.0nS<br>8 ==> 27.5nS<br>9 ==> 25.0nS<br>10 ==> 22.5nS<br>11 ==> 20.0nS<br>12 ==> 17.5nS<br>13 ==> 15.0nS<br>14 ==> 12.5nS<br>15 ==> 10.0nS | 0 ==> 5.00nS (200MHz)<br>1 ==> 4.75nS<br>2 ==> 4.50nS<br>3 ==> 4.25nS<br>4 ==> 4.00nS<br>5 ==> 3.75nS (267MHz)<br>6 ==> 3.50nS<br>7 ==> 3.25nS<br>8 ==> 3.00nS<br>9 ==> 2.75nS<br>10 ==> 2.50nS (400MHz)<br>11 ==> 2.25nS<br>12 ==> 2.00nS<br>13 ==> 1.75nS<br>14 ==> 1.50nS<br>15 ==> 1.25nS (800MHz) |

Fig. 16

Organization Register 440

| [7:4] | [3:2] | [1:0] |
|---|---|---|
| Number of Banks | Pages per Banks | Page/Cache size (lines) |
| (0 ==> 16 banks) | 00 ==> 4096<br>01 ==> 8192<br>10 ==> 16384<br>11 ==> 32768 | 00 ==> 16, 144 bit words<br>01 ==> 32, 144 bit words<br>10 ==> 64, 144 bit words<br>11 ==> 128, 144 bit words |
| 422 | 424 | 426 |

MEMORY ARRAY AND METHOD WITH SIMULTANEOUS READ/WRITE CAPABILITY

TECHNICAL FIELD

The present invention relates to memory arrays and more particularly a system that has the capability to read data from and write data to one or more memory locations at the same time.

BACKGROUND OF THE INVENTION

Increasing networking speeds and port densities have fueled the demand for memory arrays, such as dynamic random access memories (DRAMs), having high bandwidth memory. Although it may be possible to increase data transfer speeds by using a faster clock, DRAMs tend to be latency-intensive; that is, they often exhibit significant propagation delays between receipt of a data request and a data output responsive to the request. The delays are often large enough to overwhelm the clock, requiring a re-synchronization mechanism to synchronize the data output with, for example, a clock in a data receiving device, such as an application-specific integrated circuit (ASIC). Further, currently known memory arrays tend to have low bus efficiencies and/or low bandwidths due to limitations in the DRAM bus, such as restrictions in the direction and/or the amount of data that can be sent to and from arrays in the DRAM.

There is a desire for a system and method that combines faster speeds with high bandwidth and high bus efficiency.

SUMMARY OF THE INVENTION

Accordingly, one embodiment of the invention is directed to a memory device, comprising a plurality of memory arrays, each memory array being coupled to an input data bus and an output data bus, a clock generator that generates an internal clock signal to generate at least one cycle to control timing of data transfer to and from the plurality of memory arrays, and a controller that controls read and write operations from and to the plurality of memory arrays, wherein the controller receives a command word containing at least a first command and a second command and executes the first and second command on the same cycle.

Another embodiment of the invention is directed to a data transfer system, comprising an application specific integrated circuit (ASIC) having a memory interface and a memory device that communicates with the ASIC via the memory interface, the memory device having a plurality of memory arrays, each memory array being coupled to an input data bus and an output data bus, a clock generator that generates an internal clock signal having at least one clock cycle to control timing of data transfer to and from the plurality of memory arrays, a controller that controls read and write operations from and to the plurality of memory arrays, wherein the controller receives a command word containing at least a first command and a second command and executes the first and second command on the same clock cycle, and wherein the ASIC sends write data and the command word to and receives read data from the memory device via the memory interface.

Another embodiment of the invention is directed to a method for accessing a memory containing a plurality of memory arrays, comprising the steps of generating an internal clock signal having at least one cycle to control timing of data transfer to and from the plurality of memory arrays, receiving a command word containing at least a first command and a second command, and executing the first and second command on the same cycle.

Yet another embodiment of the invention is directed to a memory device, comprising a plurality of means for storing data coupled to means for transferring data to and from said plurality of data storing means, means for generating at least one cycle to control timing of data transfer to and from the data, and means for controlling read and write operations from and to the plurality of memory arrays, wherein the controlling means receives a command word containing at least a first command and a second command and executes the first and second command on the same cycle.

BRIEF DESCRIPTION OF THE DRAWINGS

FIG. 10 is a chart illustrating an example of a command stream according to one embodiment of the invention;

FIG. 13 is an example of a DRAM status register in the maintenance register set shown in FIG. 11;

FIG. 14 is an example of a DRAM conflict error register in the maintenance register set shown in FIG. 11;

FIG. 15 is an example of an access timing register in the maintenance register set shown in FIG. 11;

FIG. 16 is an example of a DRAM capabilities register in the maintenance register set shown in FIG. 11;

FIG. 17 is an example of a DRAM organization register in the maintenance register set shown in FIG. 11;

DETAILED DESCRIPTION OF THE EMBODIMENTS

Figure 1:
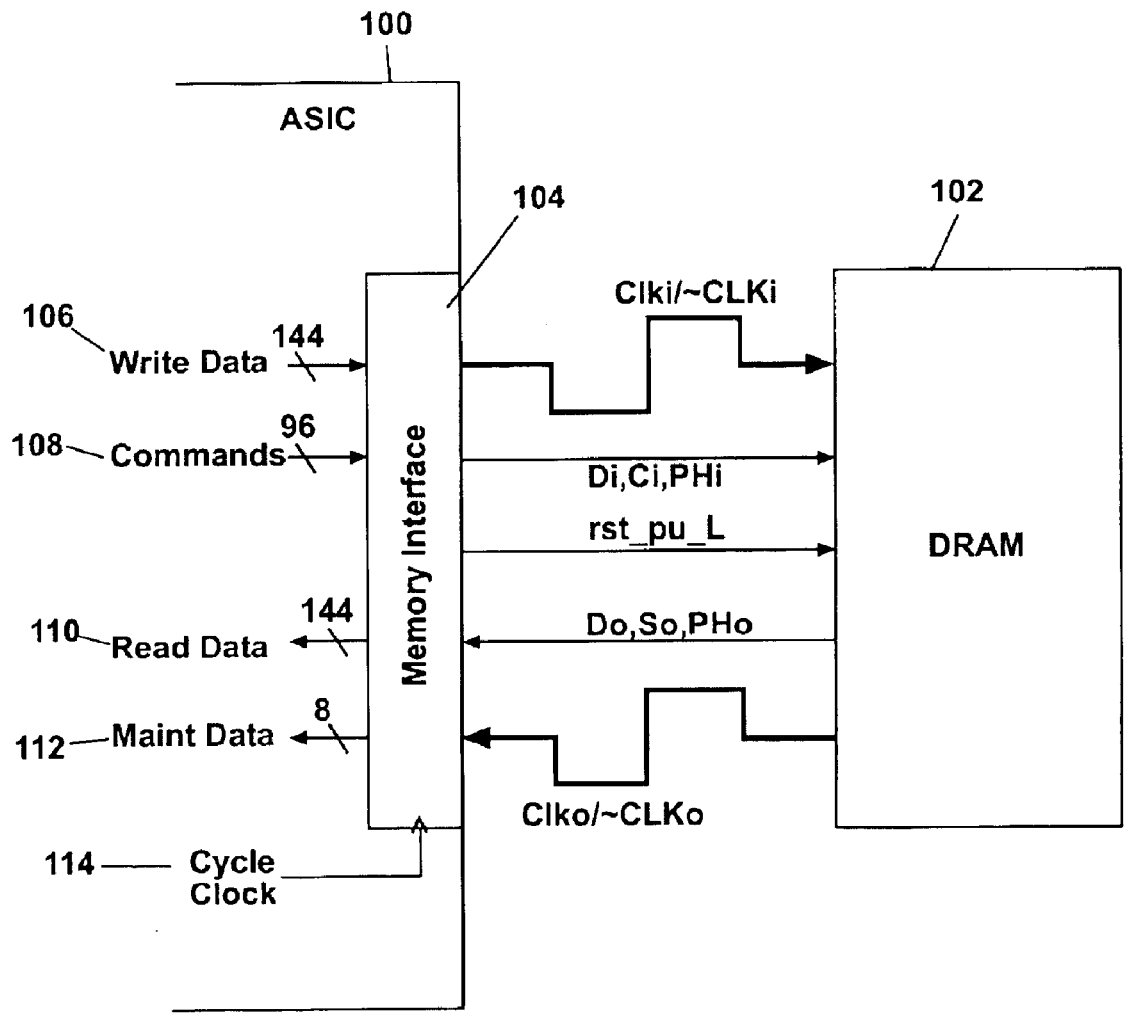
FIG. 1 is a system block diagram of an ASIC and a DRAM communicating according to one embodiment of the present invention.

FIG. 1 is a system block diagram illustrating a relationship between an application specific integrated circuit (ASIC) 100 and a dynamic random access memory (DRAM) 102 according to one embodiment of the invention. The ASIC 100 communicates with the DRAM 102 via a memory interface 104, which can be a dedicated memory interface. The memory interface 104 acts as a synchronizer by converting high-speed interface signals between the ASIC 100 and the DRAM 102 into synchronous signals usable by an ASIC core (not shown).

In this particular example, 144-bit wide write data 106 and 96-bit wide command data 108 are sent from the ASIC core to the memory interface 104 and 144-bit wide read data 110 and 8-bit wide maintenance data 112 are sent from the memory interface 104 to the ASIC core. A cycle clock 114 is also coupled to the memory interface 104 to control the timing of data transfer to and from the DRAM 102, which will be explained in greater detail below. Note that the data shown in FIG. 1 as well as subsequent figures described below can have sizes other than those shown in the Figures without departing from the scope of the invention.

Figure 2:
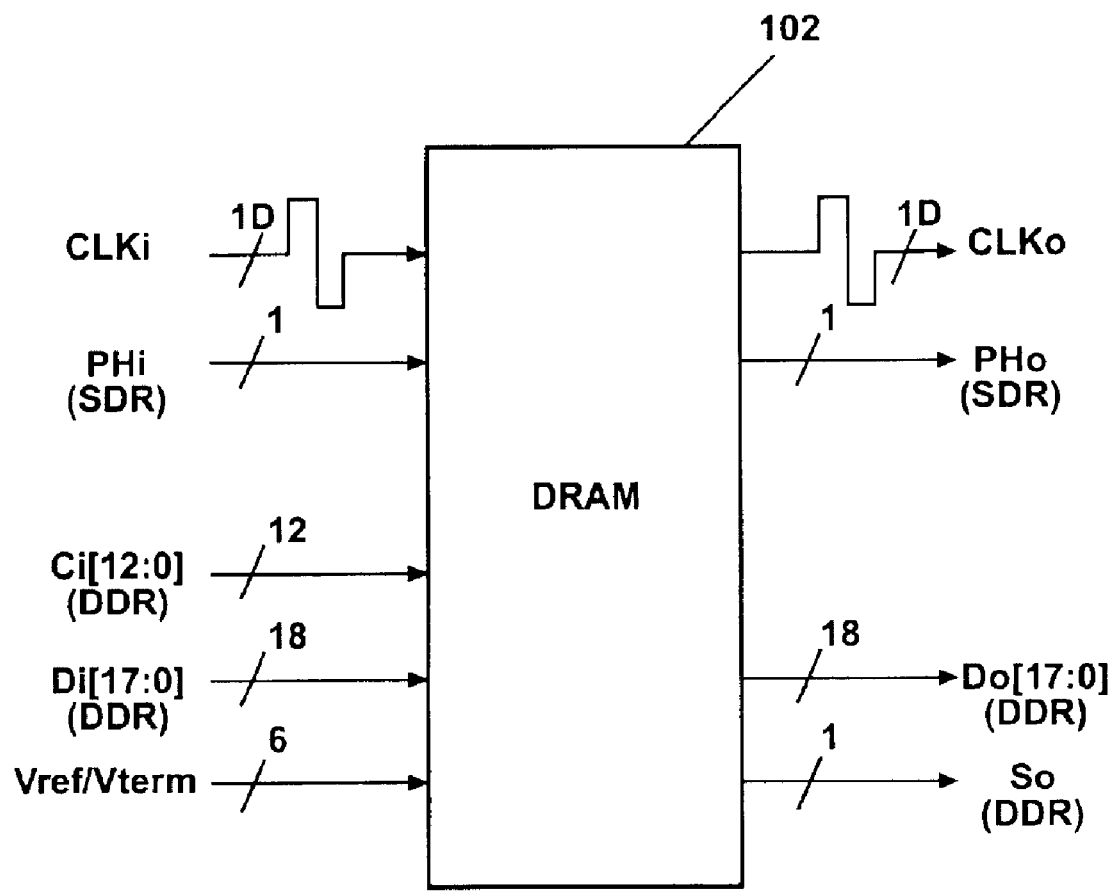
FIG. 2 is a representative diagram of a DRAM according to one embodiment of the present invention.

FIG. 2 illustrates inputs and outputs of the DRAM 102 in greater detail. The DRAM 102 receives as inputs an input clock CLKi, an input phase signal PHi that is synchronous to the input clock CLKi, an input command bus Ci, an input data bus Di, and a reference voltage/termination voltage Vref/Vterm line. In one embodiment, the input clock CLKi, the input phase signal PHi, the input command bus Ci, and the input data bus Di are all high speed transceiver logic (HSTL) signals and the Vref/Vterm provide the reference voltage and terminal voltage, respectively, for the HSTL inputs. Further, in one embodiment, a termination mechanism (not shown), such as a 1.5V input/output supply and a 0.75V termination supply are included on both the DRAM 102 and the ASIC 100, allowing use of internal termination resistors, thus eliminating the need for external resistors and allowing tight point-to-point routing and good transmission line impedance control. The reference and termination supplies may be combined as an external device rather than kept separate to maintain signal integrity.

In one embodiment, transfers to and from the DRAM 102 are blocked together into a transfer cycle containing 4 clock cycles (8 consecutive clock edges). In this case, each pair of clock edges (each full clock cycle) is referred to as a "transfer phase". As a result, each transfer cycle in this embodiment contains 4 transfer phases, spanning 4 clock cycles. The clock rate for the DRAM 102 in this embodiment is equal to CLK_IN (the clock rate for input clock CLKi) while the transfer cycle rate for the RAM is equal to CLK_IN/4 (or some other fraction) of the clock rate. In other words, the transfer cycle in one embodiment contains multiple clock cycles (four, in this example), wherein the transfer cycle runs at a fraction of the external clock rate CLK_IN.

The input and output phase signals PHi, PHo communicate the transfer phase for inputs and outputs, respectively, and in both cases, the receiving device (i.e., the RAM 102 for PHi and the ASIC 100 for PHo) resynchronizes the signal and may retain recent signal history so that it can uniquely identify a current transfer phase. In one embodiment, PHi is high for two CLK_IN cycles and then low for two CLK_IN cycles; if the receiving device maintains PHi delayed by 1 clock cycle as a signal history, the device can uniquely identify the four possible clock phases during a PHi cycle.

In one embodiment, the command and data inputs and outputs (Ci, Di, Co, and Do) transfer data on each clock edge, while the input and output phase signals (PHi, PHo) transfer data on one edge, such as the positive edge, of the clock. Further, in one embodiment, input clock CLKi samples all DRAM inputs (i.e., PHi, Ci, and Di) while the output clock CLKo provides timing for all of the DRAM outputs (i.e., PHo, Do). In one embodiment, the input clock CLKi and/or the output clock CLKo are differential and delayed from the signals they sample to ensure proper sampling. For example, in the case of sampling an input signal, the CLKi lines may be made longer than the PHi/Ci/Di lines, allowing the same clock edge to generate data and sample the data. Further, delaying the output clock may help ensure proper sampling of valid data and ensure matching between inputs and outputs, cancelling clock-to-clock jitter.

Because the cycles in one embodiment of the inventive system contain multiple clocks, data can be assembled and moved synchronously because the extended cycles remove latency in the DRAM 102. More particularly, assigning multiple clocks per cycle, wherein the cycle is long enough for the DRAM 102 to receive and output the data back to the ASIC 100 before the end of a cycle, provides automatic synchronization between the DRAM 102 and the ASIC 100. Thus, rather than inserting multiple clocks' worth of delay in the output signal to resynchronize the output signal with the internal ASIC clock, the inventive system transfers sufficiently large atomic blocks of data so that the total round trip time to the DRAM 102 and back from the DRAM 102 is less than the block transfer time. As a result, the ASIC 100 receives a full, valid transfer on each cycle before it begins its next cycle, eliminating the need for conventional resynchronization techniques.

In one embodiment, data is transferred between the DRAM 102 and the ASIC 100 in 144-bit units over the data busses Di, Do, assuming 4 clocks per cycle (8 clock edges) and 18 bits per clock edge. Further, in one embodiment, commands are transferred in a similar manner, with 96-bits transferred in each cycle (e.g., 9 bits per clock edge).

Figure 3:
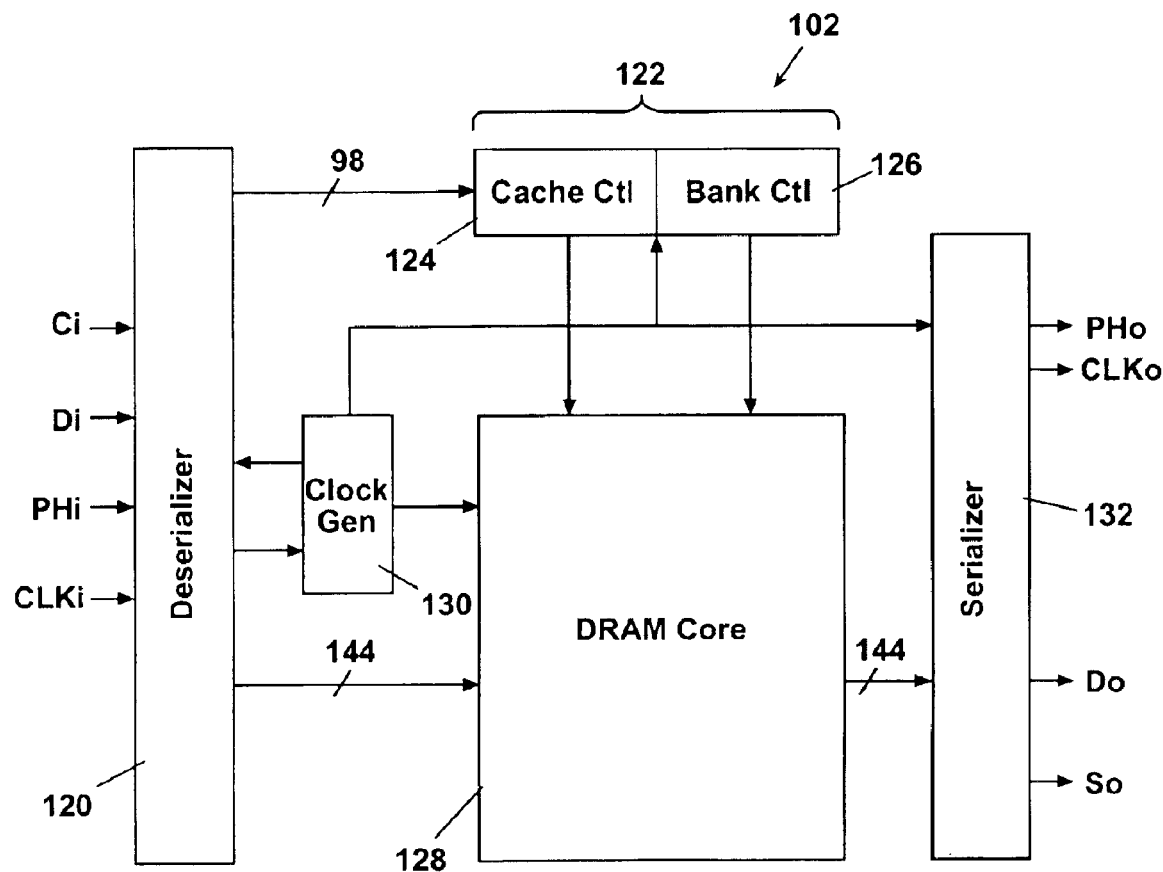
FIG. 3 is a block diagram illustrating details of the DRAM shown in FIG. 2.

FIG. 3 illustrates the components of the DRAM 102 according to one embodiment in greater detail. Note that FIGS. 3 through 17 and their corresponding descriptions below will address the overall operation of the DRAM 102, while the specific operation and timing of each of the components in FIG. 3 according to one embodiment of the invention will be explained in greater detail below with respect to FIGS. 19 through 26.

Command signal Ci, data signal Di, input phase signal PHi and input clock CLKi are all input into a deserializer 120. The deserializer 120 in one embodiment creates a 96-bit wide entity, which is the command in this embodiment, and also creates a 144-bit wide entity, which is the data. The command is sent to a control block 122 that contains a cache controller 124 and a bank controller 126 that control read and write operations from and to a DRAM core 128. The data is sent directly to the DRAM core 128. This DRAM core contains a number of DRAM arrays and associated caching support.

The deserializer 120 also sends the input phase signal PHi and the input clock signal CLKi to a clock generator 130. The clock generator 130 outputs a clock signal to the DRAM core 128 as well as back to the deserializer 120. In one embodiment, the DRAM core 128 runs at one-fourth the input clock CLKi frequency. Both the clock generator 130 and the DRAM core 128 also output signals to a serializer 132, which in turn generates the output phase signal PHo, the output clock CLKo, the output data Do, and an optional status signal So to a receiving device, such as the ASIC 100.

Figure 4:
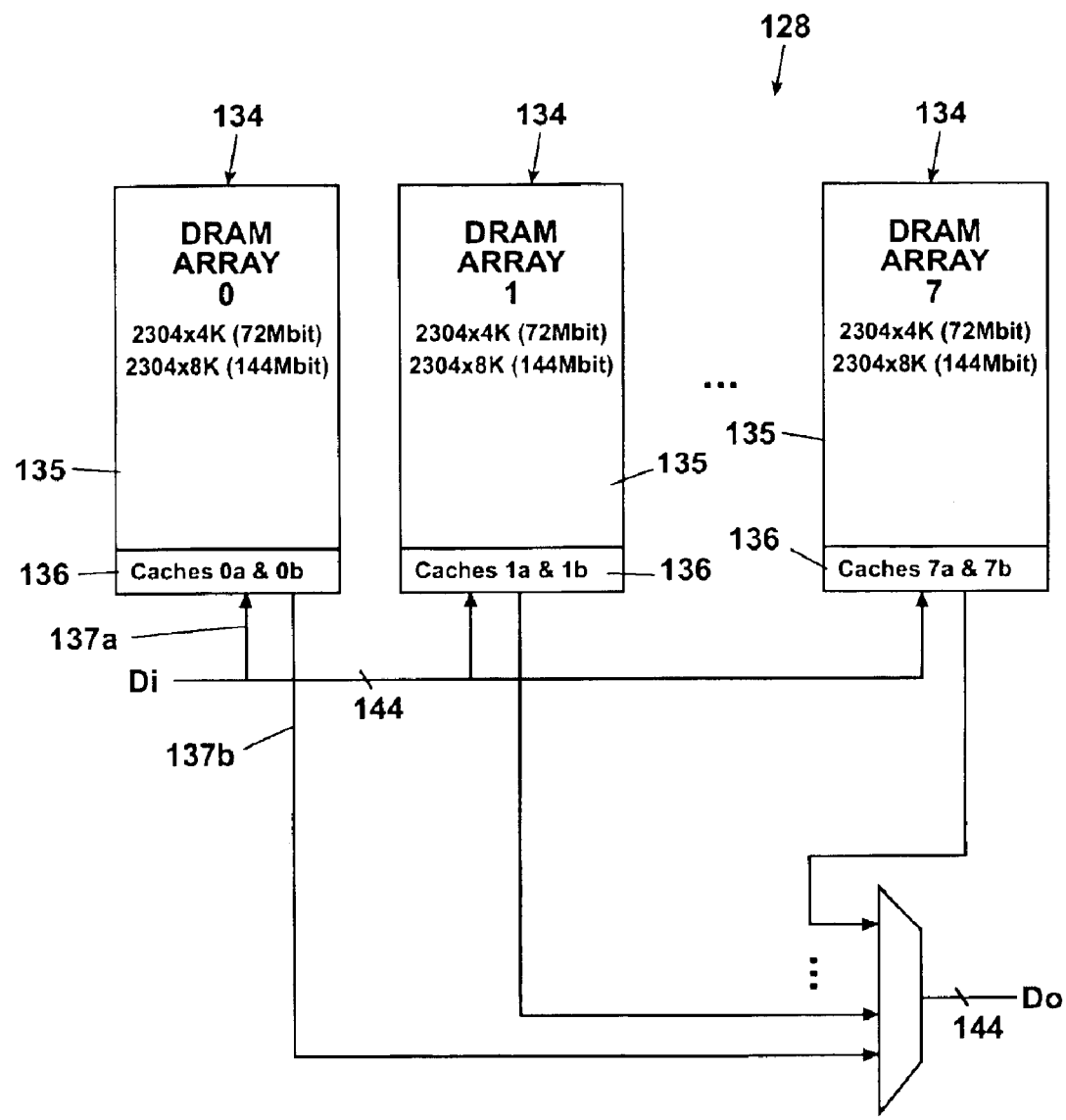
FIG. 4 is a block diagram illustrating one embodiment of a DRAM core in the DRAM shown in FIG. 3

FIG. 4 illustrates one possible configuration for the DRAM core 128. In one embodiment, the DRAM core 128 includes a plurality of banks 134, each bank containing a memory array 135 and at least one associated cache 136. In one embodiment, each bank 134 has two associated caches a and b. In one embodiment, one cache a is associated with data flowing into the array 135 and the other cache b is associated with data flowing out of the array 135. Associating two caches a, b to each bank 134 provides low latency in the DRAM 102 even when read and write operations are directed to the same bank 134.

Note that conventional DRAMs only have one data bus, allowing data to flow only into an array or only out of the array, and consequently only into the DRAM or only out of the DRAM, at any given time; data cannot flow both into and out of an array or the DRAM simultaneously. The embodiment shown in FIG. 4 includes multiple busses (in this example, two busses 137*a*, 137*b*) so that data can flow into and out of the arrays 135 simultaneously. For example, input data Di may stream data into array 0 via a first bus 137*a* and, at the same time, output data Do may stream data out of the array 0 into a buffer 138 via a second bus 137*b* for outputting to the ASIC 100. As a result, the multiple bus and multiple cache configuration in the DRAM core 128 allows data to be read into and out of the DRAM simultaneously. The specific size of the arrays 135 and the caches 136*a*, 136*b* can be selected based on the overall memory size. For example, 288 and 576 Mbit devices may use caches holding 4608-bit and arrays holding 4608×8 K and 4608×16 K, respectively. In this case, each array would have a page size of 4608 bits. Similarly, for 72 and 144 Mbit devices, the cache 136*a*, 136*b* may hold 2304 bits and the array 135 may have a page size of 2304 bits. Of course, other sizes and variations are possible.

Figure 5:
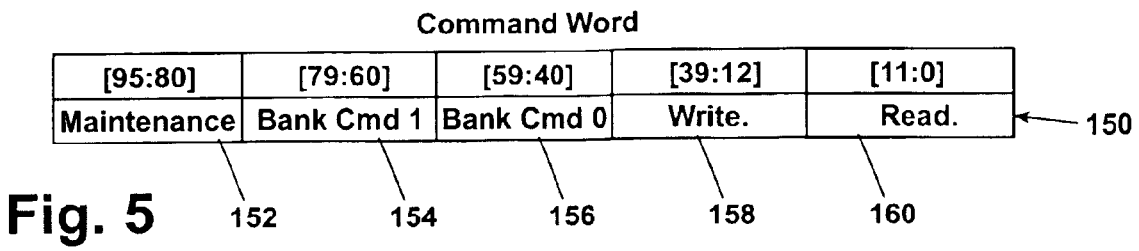
FIG. 5 is an example of a command structure used in one embodiment of the invention.

FIGS. 5 through 9 are representative diagrams illustrating embodiments of possible command structures used in the inventive system. As noted above with respect to FIG. 3, an input command Ci may be sent to the cache controller 124 and bank controller 126 for each cycle. FIG. 5 illustrates one example of a 96-bit wide command word 150 that could serve as the input command Ci. In this embodiment, the command word 150 includes a maintenance command 152, a first bank command 154, a second bank command 156, a write command 158 and a read command 160. Note that because the DRAM 102 will receive a command word containing both a read command and a write command in each cycle, a read operation and a write operation will occur on each cycle as well. Each of these commands in the command word 150 will be described in greater detail below.

Figure 6:
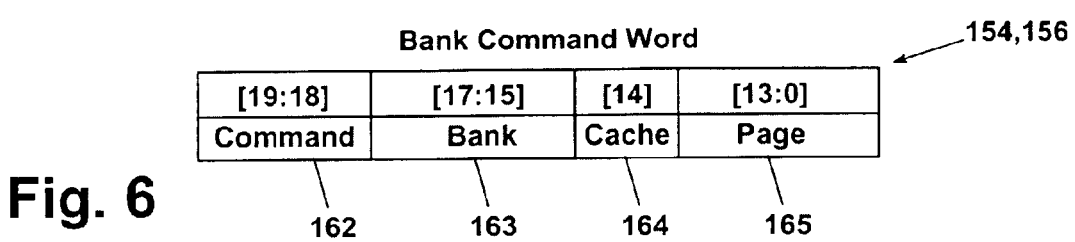
FIG. 6 is an example of a bank command in the command structure shown in FIG. 5.

FIG. 6 illustrates an example of a bank command 154, 156 according to one embodiment of the invention. In one embodiment, each bank command 154, 156 embodiment uses 20 bits, with 2 bits designating a particular command 162, 4 bits to designate a particular bank and cache 163, 164, and 14 bits to designate a particular page number 165. Because the command word 150 includes two bank commands 154, 156, the total bits used for bank commands in this embodiment is 40 bits.

The command itself 162 in the bank command word 154, 156 may be one of four possible commands. An NOP command instructs the DRAM core 128 to simply do nothing and wait until it receives the next command Ci. A SAMPLE[b,c,p] command instructs the controller 122 to load page p from bank b into cache c (i.e. the bank, cache and page 163, 164, 165 designated in the bank command word 154, 156) and writes the data back to the elements where the data was obtained, refreshing those elements. A LOAD[b,c,p] command instructs the controller 122 to load page p from bank b into cache c, and a SAVE[b,c,p] command instructs the controller 122 to load page p from bank b into cache c.

Note that in one embodiment, the timing for bank operations is controlled by an access timing register, such as the one shown in FIG. 16 and explained in greater detail below. More particularly, LoadTime and SaveTime fields in the access timing register of FIG. 16 may dictate the timing for loading and saving operations, respectively. Also, the banks 134 in one embodiment are independent and any combination of banks may be performing any of the bank operations simultaneously. In this embodiment, the command word 150 contains two bank commands; as a result, two independent bank operations may be conducted on during any given cycle at the same time.

Regardless of the specific bank command, a bank command request in one embodiment causes the selected bank to become occupied for a selected number of cycles (e.g., 1 to 16 cycles, depending on the command type and the values set in, for example, the access timing register shown in FIG. 16). If another command arrives for a particular bank while it is occupied, the bank controller 122 ignores the command is ignored and registers an error by, for example, writing to a conflict error register (explained in greater detail below). Further, if both bank commands 154, 156 in a given command word 150 refer to the same bank 134 and neither bank command is an NOP (i.e., a "do nothing" command), the bank controller 122 executes one bank command, such as the first bank command 154, 156 and registers an error. Note that a DRAM controller (not shown) in the ASIC 100 would normally be charged with avoiding these errors.

In one embodiment, the DRAM 102 periodically conducts a refresh operation to keep the pages in the arrays 134 valid. The refresh operation may be handled by explicit load/save commands or by sample commands in the input command Ci. For example, if the pages that need to be kept valid should be sampled or loaded/saved every 32 ms, and if there are 4K pages per bank and 8 banks, a sample operation should be conducted every 977 ns (at 267 Mhz, this amounts to about 1% of the total bank command bandwidth). Each load operation preferably has a corresponding save operation because DRAM reads are destructive; however, load operations without corresponding save operations may be allowed if the controller 122 has completed access to a given page and considers the page invalid. Note that invalid pages do not need to be refreshed. Because the load and save commands are independent and because read, write and sample operations can be simultaneously directed to different banks, the refresh operation can be hidden behind other read and write operations in most situations by executing the refresh operation as data is being transferred in response to other read and write commands.

Figure 7:
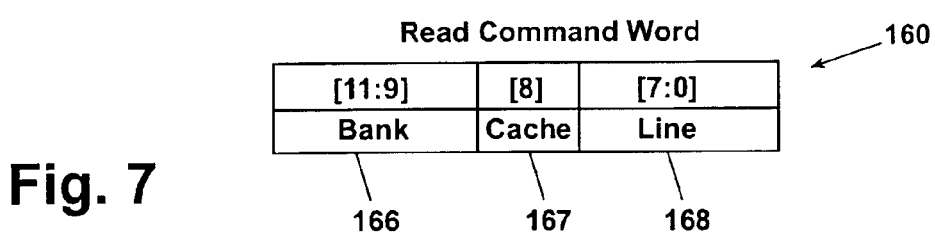
FIG. 7 is an example of a read command in the command structure shown in FIG. 5.
Figure 8:
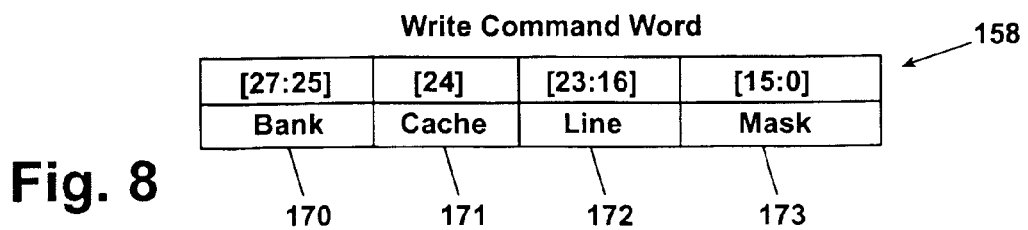
FIG. 8 is an example of a write command in the command structure shown in FIG. 5.

FIGS. 7 and 8 are representative diagrams illustrating one embodiment of the read command 160 and the write command 158 in the command word 150 in more detail. Both the read command 160 and the write command 158 are directed to the caches 136. Further, because the banks 134 in this example have one read port and one write port, each command word 150 has one read command 160 and one write command 158 for each cycle.

Referring to FIG. 7, the read command 160 may have 4 bits for selecting the specific bank 166 and cache 167 and 8 bits to select a specific cache line 168. In this embodiment, the read command 160 can support caches up to 256 words deep. From this command READ[b,c,l], the controller 122 directs the caches 136, to place of the data contained in line l of bank b's cache c onto the output bus 137b.

Referring to FIG. 8, the write command 158 may have 4 bits to select the bank 170 and cache 171, 8 bits to select a specific cache line 172, and 16 bits to act as a byte mask 173. From the WRITE[b,c,l,m] command 158, the controller 122 directs the caches 134 to place input data (e.g., data Di) into cache c, line l of bank b. Further, the WRITE[b,c,l,m] command 158 instructs the caches to write only those fields having a corresponding mask bit=0.

In one embodiment, a read operation and a write operation are performed on every cycle and coordinated with appropriate sample, load and save operations to keep the DRAM 102 streaming. Because both read and write commands appear in every cycle, burst commands are not needed in one embodiment of the inventive system. Further, read operations involve a round trip for the data, from the ASIC 100 to the DRAM 102 back to the ASIC 100; in one embodiment, several cycles (e.g., six cycles) elapse between the time the ASIC 100 sends the read command 160 and the time the DRAM 102 returns data to the ASIC 100 in response to the read command 160.

In one embodiment, the controller 122 discards unwanted read commands and encodes unwanted write commands with all mask bits asserted or rewrites earlier written data. Unwanted read commands may occur because read commands are executed even though a given test command may not actually require a read. In this case, the controller 122 commands a dummy read and discards the resulting data. Unwanted write commands may occur when, for example, the controller has no data to write; in this case, the controller 122 may command write operations to a dummy location or write to areas that are masked off. Further, in one embodiment, both read and write commands are always valid commands and do not have any error conditions. If a command word 150 contains a read command 160 and a write command 158 directed to the same line in the same bank, the controller 122 reads the old data in the bank before the write command is executed.

Figure 9:
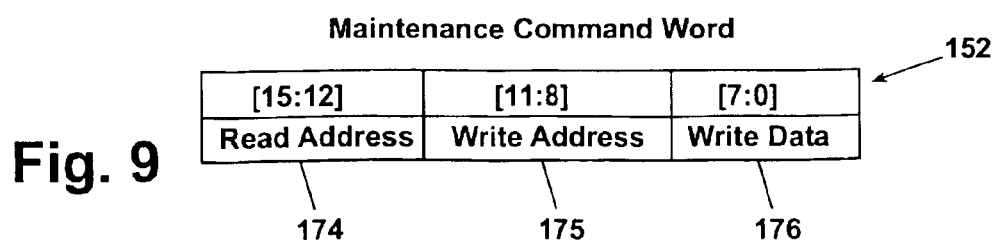
FIG. 9 is an example of a maintenance command in the command structure shown in FIG. 5.

FIG. 9 illustrates one embodiment of a maintenance command 152 that may be included in the command word 150. In one embodiment, the maintenance command 152 is transmitted on each cycle to modify operation of the DRAM 102 as well as to query the DRAM status via, for example, a register array format. In one embodiment, the DRAM 102 supports a 16-bit maintenance command 152 that occurs in each cycle. The maintenance command 152 specifies a read address 174, a write address 175 and write data 176. In response to the read instruction 174, the controller 122 will read the data from the specified read address 174 to query the DRAM status at that address. Further, the write instruction 175 causes the controller 122 to write the data 176 in the maintenance command 152 to the specified write address 175, modifying DRAM operation. Generally, maintenance commands 152 may be used to initialize the DRAM 102 and thereafter check the status of the DRAM 102. In one embodiment, like the read command 160 described above, several cycles may elapse between the time the read instruction 174 from the maintenance command 152 is sent to the DRAM 102 from the ASIC 100 and the time the DRAM 102 returns data to the ASIC 100 in response to the read instruction 174.

FIG. 10 is a chart illustrating one example of a command stream for DRAM operation. In this particular example, it is assumed that the load (LD) timing and save (SV) timing are 3 cycles and the sample (SM) timing is 6 cycles; however, the operations may involve any number of cycles, depending on the specific application and the DRAM array characteristics. Note that FIG. 10 and the description below are for illustrative purposes only and illustrate only one of many possible operations for the DRAM.

FIG. 10 illustrates the various information in various command words 150 and the operations carried out in response to a given command word sequence. As noted above, a command word 150 is sent to the DRAM 102 at every transfer cycle; thus, each command word in FIG. 10 below corresponds to one transfer cycle. In this example, "bank" refers to a DRAM bank (0 through 7), "cache" refers to a cache (a or b) associated with a bank, "page" refers to one page in a bank (0 through 0x3fff), and "line" refers to a specific line within a cache (0 through 15). Note that, in this example, a load instruction LD loads a specified cache with a specified page from a specified bank. The operations carried out by the example in FIG. 10 are as follows:

1. Use both cache a and cache b in bank 1 to allow reading of lines c, d, e and f of page 1 and reading of lines 0 and 1 of page 2 in bank 1.
2. Use cache a in bank 0 to allow writing of lines 0 and 1 of page 0 in bank 0.
3. Use cache a of bank 3 to read lines to allow reading of lines 0 and 5 of page 0 in bank 3.
4. Use cache a of bank 2 to allow writing of lines 5 and 1 of page 0 in bank 2.
5. Use cache a of bank 4 to allow writing of lines 1, 2 and 0 of page 0 in bank 4.
6. Use cache a of bank 5 to refresh page 7 in bank 5.

In this example, command word at cycle 1 includes a first bank command 154 that instructs the DRAM 102 to load bank 0, page 0 into cache 0a (i.e., cache a of bank 0). In the second bank command 156 in cycle 1, the command word instructs the DRAM 102 to sample bank 1, page 0 into cache 1a. Load and sample commands also appear in the next two command words in the next two cycles 2 and 3, where the command word at cycle 202 instructs the DRAM 102 to load bank 2, page 0 into cache 2a, sample bank 3, page 0 into cache 3a and command word at cycle 3 loads bank 4, page 0 into cache 4a and sample bank 5, page 7 into cache 5a.

At cycle 4, caches 0a and 0b have completed loading (because 3 cycles have elapsed from the load request in the command word from cycle 1), and the command word at cycle 4 instructs the DRAM 102 to read line c from cache 1a and write line 0 of cache 0a. At cycle 5, caches 2a and 3b are already loaded and the command word at cycle 5 instructs the DRAM 102 to read line 0 from cache 3a and write line 1 of cache 0a.

The command word at cycle 6 includes a save (SV) command as well as a read and write command. The DRAM saves cache 0a to bank 0, page 0 in response to the save command, reads line d from cache 1a and writes line 5 of cache 2a. Next, the command word at cycle 7 includes a sample (SM) command along with the read and write commands. In this example, the sampling of bank 1 has been completed (because 6 cycles have elapsed from the corresponding sampling command from cycle 1) and the DRAM now samples page 2 of bank 1 into cache 1b, and the rest of the command word at cycle 7 instructs the DRAM 102 to read line 5 from cache 3a and write line 1 of cache 2a.

At cycle 8, the sampling of bank 3 is complete (because 6 cycles have elapsed from the corresponding sampling command from cycle 2) and the command word at cycle 8 instructs the DRAM 102 to start saving cache 2a to bank 2, page 0, read line e from cache 1a, and write line 1 of cache 4a. During the next cycle 9, the refresh of bank 5, page 7 is completed (because 6 cycles have elapsed from the corresponding sample command from cycle 3) and the saving of bank 0 is completed (because 3 cycles have elapsed since the corresponding save command from cycle 6). The command word at cycle 9 instructs the DRAM 102 to read line f from cache 1a and write line 2 of cache 4a. During cycle 10, cache 1b completes loading. Further, the read commanded in cycle 4 (bank 1, page 1, line c) arrives and is valid in the ASIC 100 at cycle 10; in other words, the read data requested in cycle 4 has been latched, serialized, transmitted across the bus, deserialized, and relatched in the ASIC 100. The command word at cycle 10 instructs the DRAM 102 to read line 0 from cache 1b and write line 0 of cache 4a. During this cycle, the save requested in cycle 6 also completes.

During cycle 11, the read requested in cycle 5 is valid in the ASIC 100. The command word at cycle 11 instructs the DRAM 102 to start saving bank 4 and read line 1 from cache 1b.

The remaining cycles 12 through 17 shown in FIG. 10 do not have associated command words in this example (although they would in normal operation), and therefore the DRAM 102 is not instructed to begin any new operations. Cycles 12 through 17 illustrate the completion of operations requested in previous cycles, while cycles 4 through 10 illustrate the ability of one embodiment of the invention to sustain full bandwidth utilization on both read and write busses simultaneously.

Figure 11:
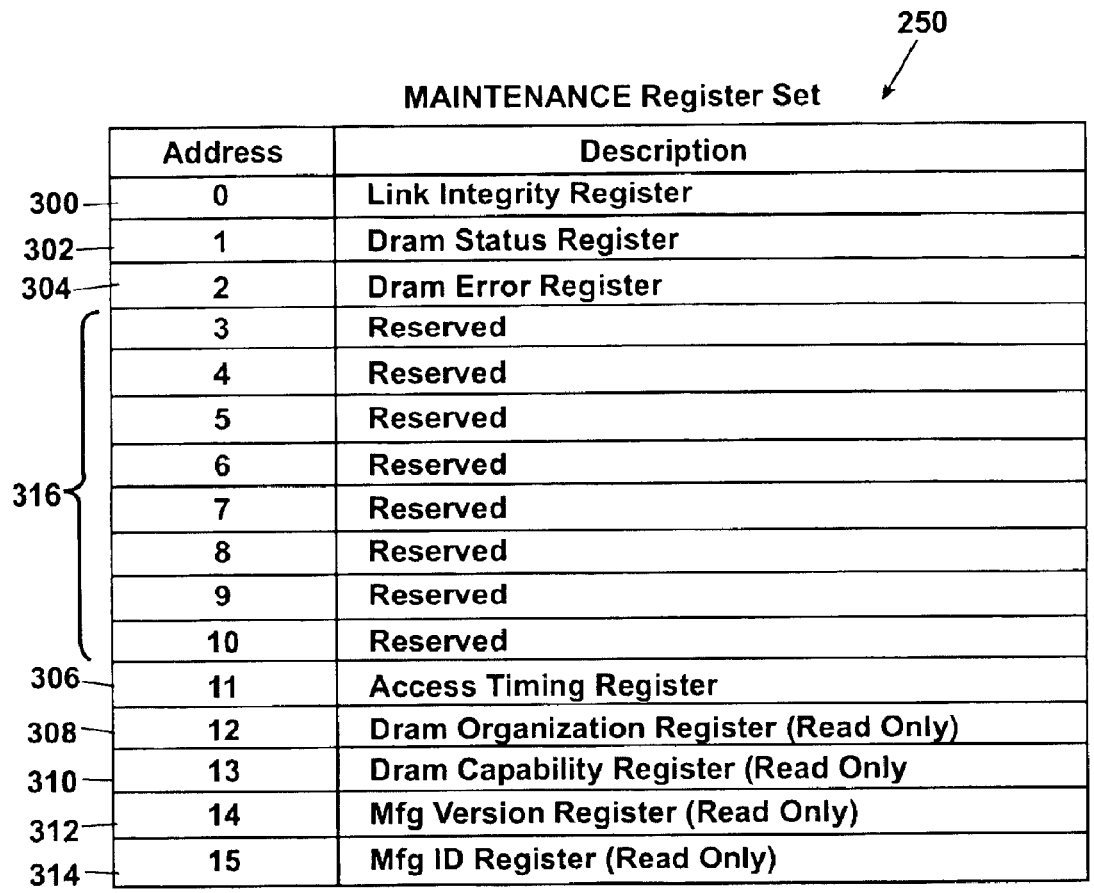
FIG. 11 is a chart illustrating a maintenance register set according to one embodiment of the invention.

FIG. 11 illustrates a maintenance register 250 according to one embodiment of the invention. In one embodiment, the maintenance register 250 is an array of sixteen one byte wide registers. Further, in one embodiment, a read and a write of the maintenance register set is defined in the maintenance command 152 (FIG. 9) on each transfer cycle, allowing the ASIC 100 to control operation of the DRAM 102 and also read DRAM status in the same transfer cycle. In this example, the maintenance command 152 includes a link integrity register 300, a DRAM status register 302, a DRAM error register 304, an access timing register 306, a DRAM organization register 308, a DRAM capability register 310, a manufacturing version register 312, and a manufacturing identification register 314. The maintenance register 250 may also include several unused reserved bits 316. As noted above, the maintenance command 152 in the command word 150 specifies a read command 174 and a write command 175, 176 to the register set, such as the maintenance register 250.

In one embodiment, a single output line (e.g., a line for status output So) is provided in the DRAM 102 along with the plurality of data output lines for read data (e.g., an 18-bit wide bus Do). The status output line carries the results of a read request 174 in the maintenance command 150 to the ASIC 100. In one embodiment, the latency of the read operation to the maintenance register 250 is 6 cycles. Further, in one embodiment, the maintenance command initiates 152 a read 174 and a write 175 operation to the maintenance register 250 on every cycle. Unwanted read operations 174 may be discarded and unwanted write operations may be directed to the link integrity register 300, which is a read-only register and is therefore unaffected by write operations to it.

Figure 12:
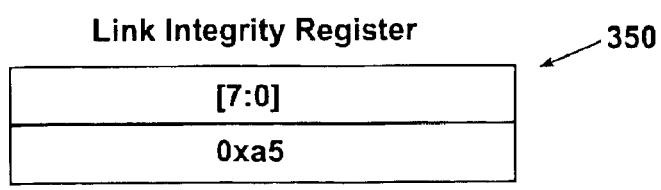
FIG. 12 is an example of a link integrity register in the maintenance register shown in FIG. 11.

FIG. 12 illustrates one example of the link integrity register 350. In this embodiment, the link integrity register 300 has 8 bits and is used to validate the link between the ASIC 100 and the DRAM 102. Note that before configuration, the So line is the only data line from the DRAM 102 that carries known, valid information because reads cannot be performed before configuration. By commanding reads of the link integrity register 300 during initialization, the ASIC 100 can compare the value actually read from the register 300 with a fixed value that should have been read. In one embodiment, the link integrity register 300 always returns the value 0xa5, regardless of any write operations directed to it.

FIG. 13 illustrates the DRAM status register 400 according to one embodiment of the invention. The DRAM status register 400 allows the DRAM 102 to report its status to the ASIC 100. The DRAM status register 400 clears when it is written. FIG. 14 illustrates the DRAM conflict error register 410 according to one embodiment of the invention. The conflict error register 410 allows the DRAM 102 to report a bank conflict error, that is, when an improper operation has been requested. When a bank conflict occurs, specific information about the conflict may be written to the conflict error register 410, setting the bank_conflict_err bit 412 in the status register 400 (FIG. 13). Because the ASIC 100 continually reads from and writes to its maintenance register 250 (e.g., one read and one write operation on each transfer cycle), the ASIC 100 will quickly detect when an error has occurred. In one embodiment, the DRAM conflict error register 410 reports the first bank conflict error that occurs since the last time the DRAM status register 400 was cleared.

FIG. 15 illustrates the access timing register 420 according to one embodiment of the invention. The access timing register 420 in this embodiment is a read/write register that allows the ASIC 100 to configure the access timing of the DRAM 102. As noted above, different operations, such as the load and save operations, use a selected number of cycles for execution. The access timing register 420 in this embodiment sets the number of cycles for executing load and save operations, accommodating DRAMs having different load and save speeds.

FIG. 16 illustrates the DRAM capabilities register 430 according to one embodiment of the invention. In one embodiment, the DRAM capabilities register 430 indicates to the ASIC 100 the clock speed and the DRAM array speed of the DRAM 102, allowing the ASIC 100 to configure the access timing register 420 (FIG. 15) to accommodate the capabilities of the DRAM 102.

FIG. 17 illustrates the DRAM organization register 440 according to one embodiment of the invention. In one embodiment, the DRAM organization register 440 is a read-only register that indicates the manner in which the DRAM 102 is organized. Three fields are supported in this embodiment indicating the maximum number of banks 422, the number of pages per bank 424, and the size of each page and cache associated with each bank 426. Other registers, such as the manufacturing version register 312 and the manufacturing identification register 314 (FIG. 11), may also be included in the maintenance register 250 as read-only registers that hold basic information about the DRAM 102, such as the manufacturer's version number and ID number, respectively. Note that any of the registers and their functions in the maintenance register 250 may be omitted, combined and/or supplemented with additional functions without departing from the scope of the invention.

Figure 18:
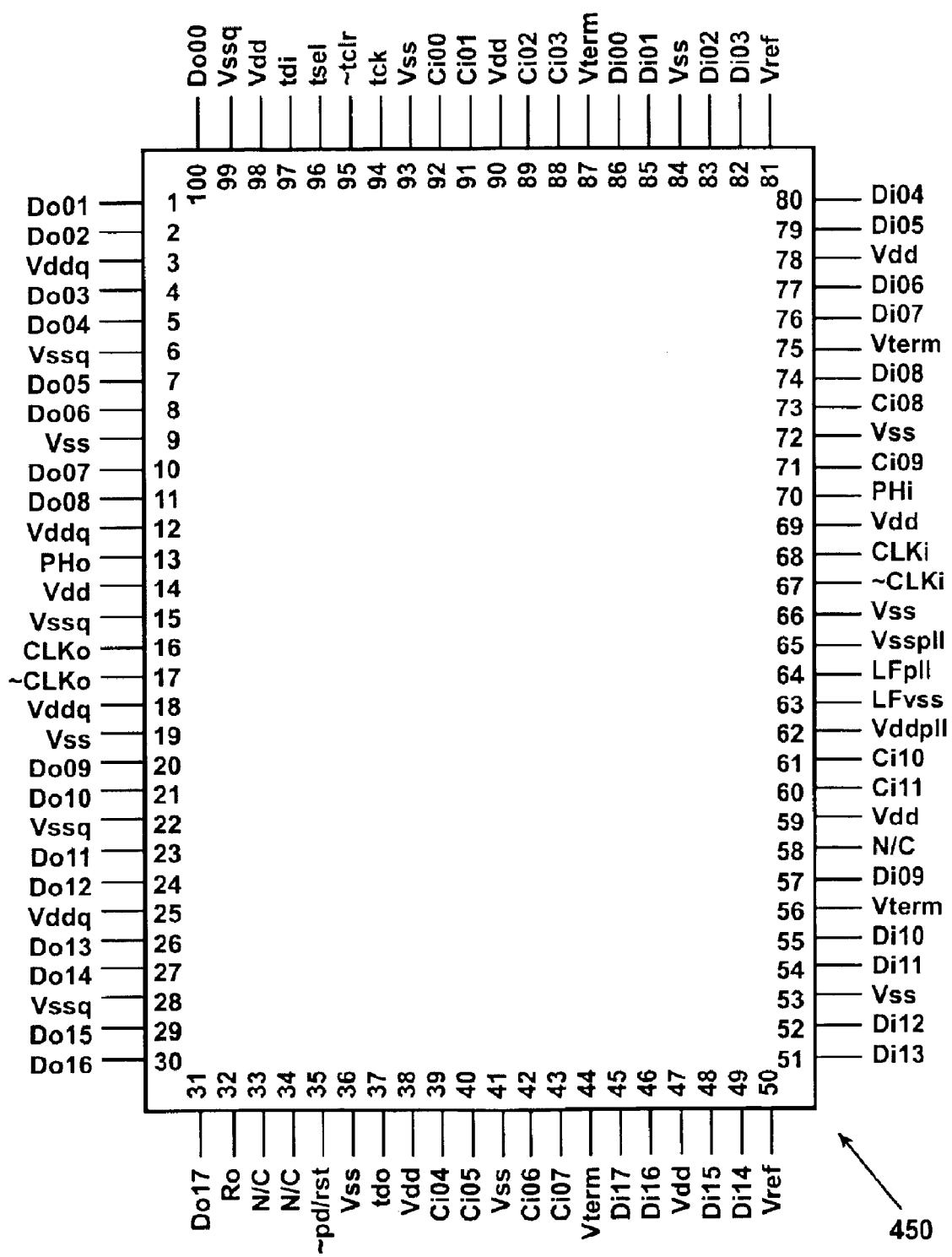
FIG. 18 is a diagram illustrating a possible pin-out configuration for a device incorporating a DRAM according to one embodiment of the invention.

FIG. 18 illustrates one possible configuration for a plastic quad flatpack (PQFP) package 450 for a DRAM according to one embodiment of the invention. In one embodiment, the package 350 has a plurality of pins corresponding to the output Do as well as a plurality of pins corresponding to the input Di.

Figure 19:
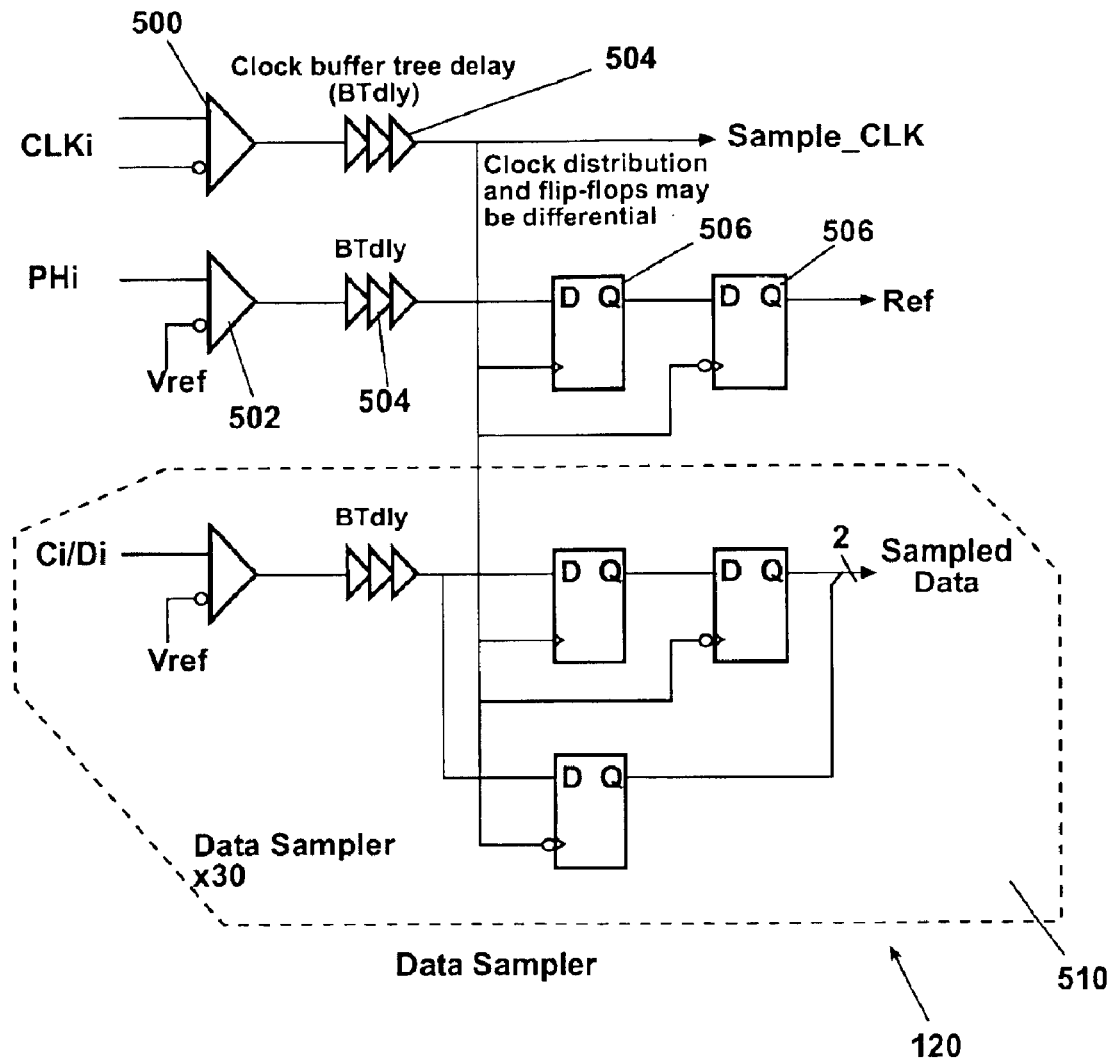
FIG. 19 is a representative diagram of a deserializer in one embodiment of the invention.

FIGS. 19 through 27 illustrate one possible way in which data travels into and out of the DRAM 102. Note that FIG. 19 through 27 illustrate one possible circuit for serializing, framing, and deserializing data in the inventive system. Those of skill in the art will recognize the specific circuit described below as a classic serializer/framing/deserializer circuit known in the art and understand that variations of the specific circuit can be applied to the inventive system without departing from the scope of the invention. FIG. 19 is a representative diagram of the deserializer 120 in the DRAM 102 according to one embodiment of the invention and shown in FIG. 2. As can be seen in FIG. 2 and in FIG. 18, the deserializer 120 receives the input clock signal CLKi, the input phase signal PHi, and command or data inputs Ci/Di. The input clock CLKi and the input phase PHi are sent into separate buffers 500, 502 along with a reference voltage Vref. The input clock signal CLKi is then sent to a delay buffer 504 and distributed to each of the input pins in flip-flops 506 as a sampling clock signal Sample_CLK to control the timing of sampling of the input phase signal PHi, the command input Ci, and the data input Di.

Note that in this embodiment, delaying the input clock CLKi allows the DRAM 102 to sample data with the same clock edge that generated the data, as noted above. In one embodiment, the amount of delay in the delay buffer 504 can be set approximately equal to the difference between one-fourth the clock period and one-fourth the cycle-to-cycle jitter (assuming four cycles per period); use of on-board delay lines is one accurate, inexpensive way to provide the delay. The input phase PHi is also sent to a delay buffer before being sent to a flip-flop 406 and sampled by the positive edge of Sample_CLK. In one embodiment, the input phase PHi is also reclocked by the negative edge of Sample_CLK and then used as a reference Ref for the clock generator 130 (FIGS. 1 and 21).

The deserializer 120 also includes one or more data samplers 510. FIG. 19 illustrates one data sampling section 510 for clarity, but one data sampler 510 may be provided for each input pin in the DRAM 102. Further, note that each input may receive either a command input Ci or a data input Di that is eventually sent to the deserializer 120; FIG. 19 covers both options through the notation Ci/Di. The data sampler 510 may also include a delay buffer 504 to delay the command and/or data input Ci/Di before it is distributed to the input pins. The delay buffer 504 for the inputs Ci/Di and the input phase PHi keeps the delay time between the inputs Ci, Di, PHi and their associated flip-flops 406 nearly equal to the delay time between the input clock CLKi and the flip-flops 406.

Figure 20:
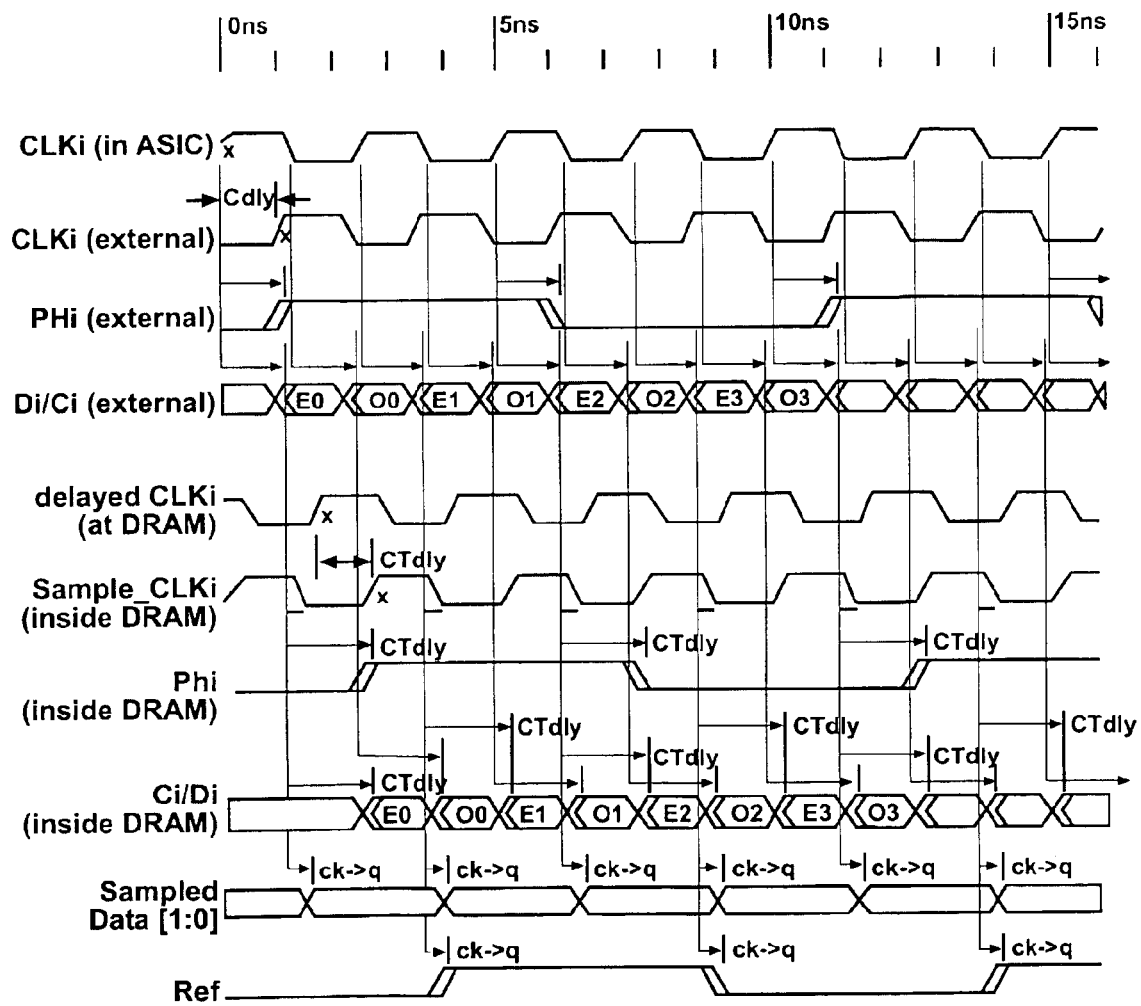
FIG. 20 is a timing diagram illustrating a relationship between signals in one embodiment of the invention.

FIG. 20 is an example of a timing diagram illustrating the timing relationships between the input clock CLKi, an internal clock in the ASIC, the input phase signal PHi, and the command and input signals Ci, Di. In one embodiment the data Di and command Ci inputs are sampled on both edges of the clock Sample_CLK and that the positive edge of a given sample is reclocked on the negative edge of Sample_CLK to perform the first step of the deserialization process. As a result, the deserializer 120 generates a 2-bit data bus that changes at the negative edge (rather than at both edges) of Sample_CLK, simplifying any transitions needed for the Sample_CLK into other clock domains.

Figure 21:
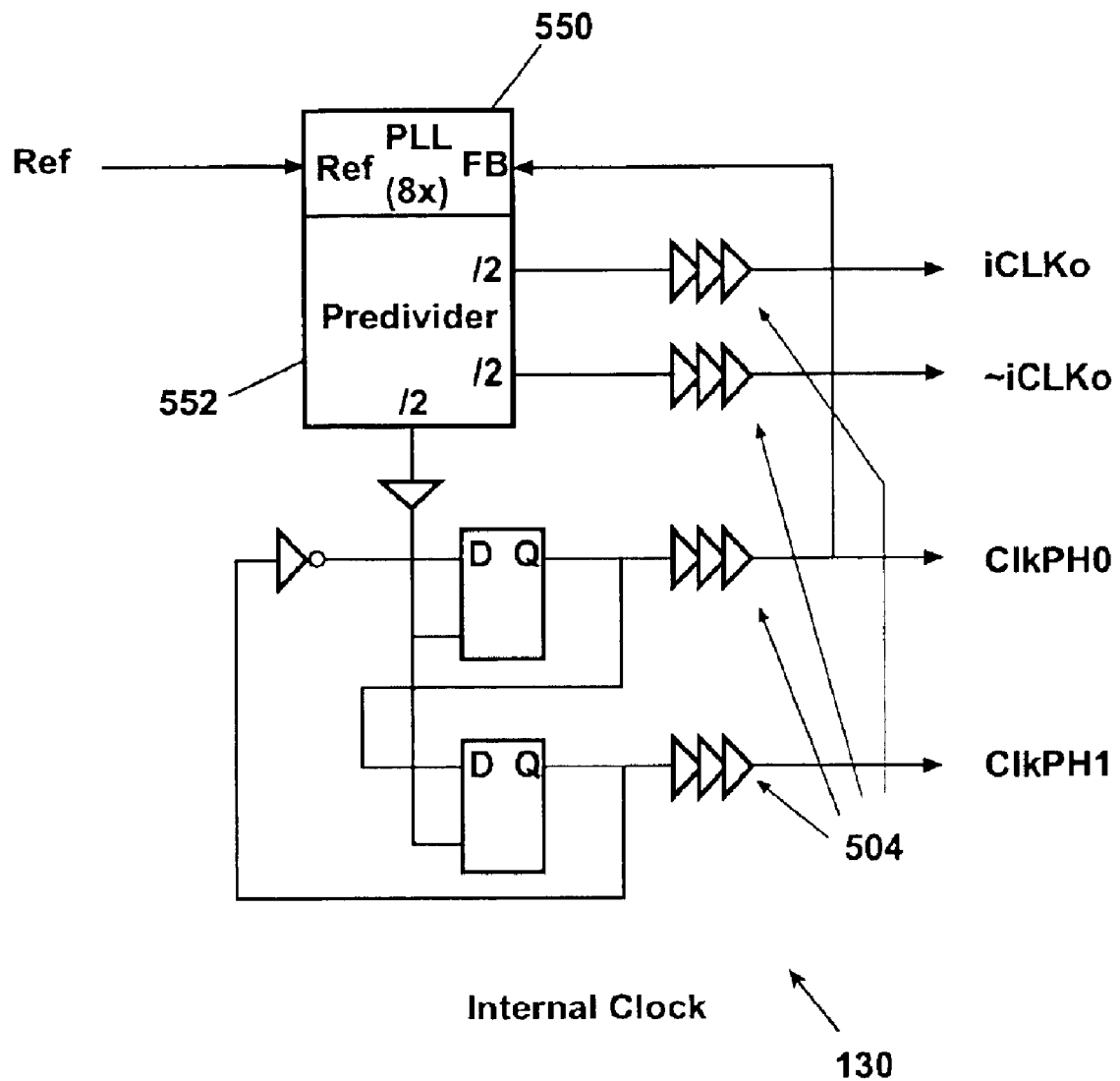
FIG. 21 is a representative diagram of an internal clock generator according to one embodiment of the invention.

FIG. 21 is a representative diagram of the clock generator 130 according to one embodiment of the invention. In one embodiment, the clock generator 130 includes a phase locked loop (PLL) circuit 550 that receives the reference clock signal Ref from the deserializer 120. The reference clock Ref is used as a reference for the PLL circuit 550 and runs at the cycle rate. Further, a feedback point FB of the PLL circuit 550 is set so that a main DRAM clock ClkPH0 is synchronized with the reference clock Ref plus the delay time of the delay buffer 504; in other words, a delayed version of the main DRAM clock is used as a feedback clock for the PLL circuit 550. This places the main DRAM clock ahead of the reference clock CLK by the amount of the delay.

In one embodiment, the PLL circuit 550 multiples the reference signal Ref by eight. A predivider 552 coupled to the PLL circuit 550 then divides the PLL output by 2 to generate internal versions of output clock signals iCLKo and ~iCLKo. Multiplying the reference clock by eight and then dividing by two helps ensure good symmetry in the output clock signal. In one embodiment, the internal versions of the output clock signals iCLKo and ~iCLKo are sent through delay buffers 504. The PLL circuit 550 also generates clock phases ClkPHx (e.g., ClkPH0 and ClkPH1 in this example) to be used for the remainder of the deserialization process, the output serialization process (to be described later) and general on-chip use by the DRAM 102. In one embodiment, all of the clocks generated by the PLL circuit 550 and predivider 552 iCLKo, ~iCLKo, ClkPHx are buffered and delayed with matching delay times.

Figure 22:
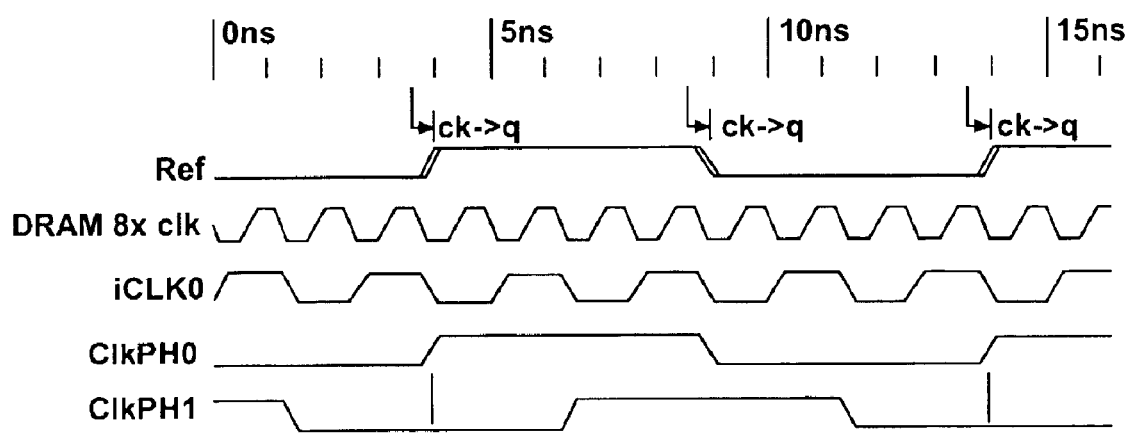
FIG. 22 is a timing diagram illustrating clock phase relationships for the internal clock generator of FIG. 21.

FIG. 22 is a timing diagram illustrating a timing relationship between the reference signal Ref, the DRAM clock signal, the internal output clock signal iCLKo, and the clock phases ClkPHx according to one embodiment of the invention. In the embodiment shown in FIG. 22, the clock phases ClkPHx lie slightly ahead of the reference clock Ref, and therefore also lie just ahead of the negative edge of the sample clock Sample_CLK. This relationship between the clock phases ClkPHx and the sample clock Sample_CLK simplifies transitions between the sample clock Sample_CLK domain and the clock phase ClkPHx domains because flops in the ClkPHx domains can use signals from the Sample_CLK domain directly. Note that in this embodiment, the clock phase ClkPH0 is locked to the reference clock and the transitions of the clock phases ClkPHx occur on the negative edge of the internal output clock iCLKo.

Figure 23:
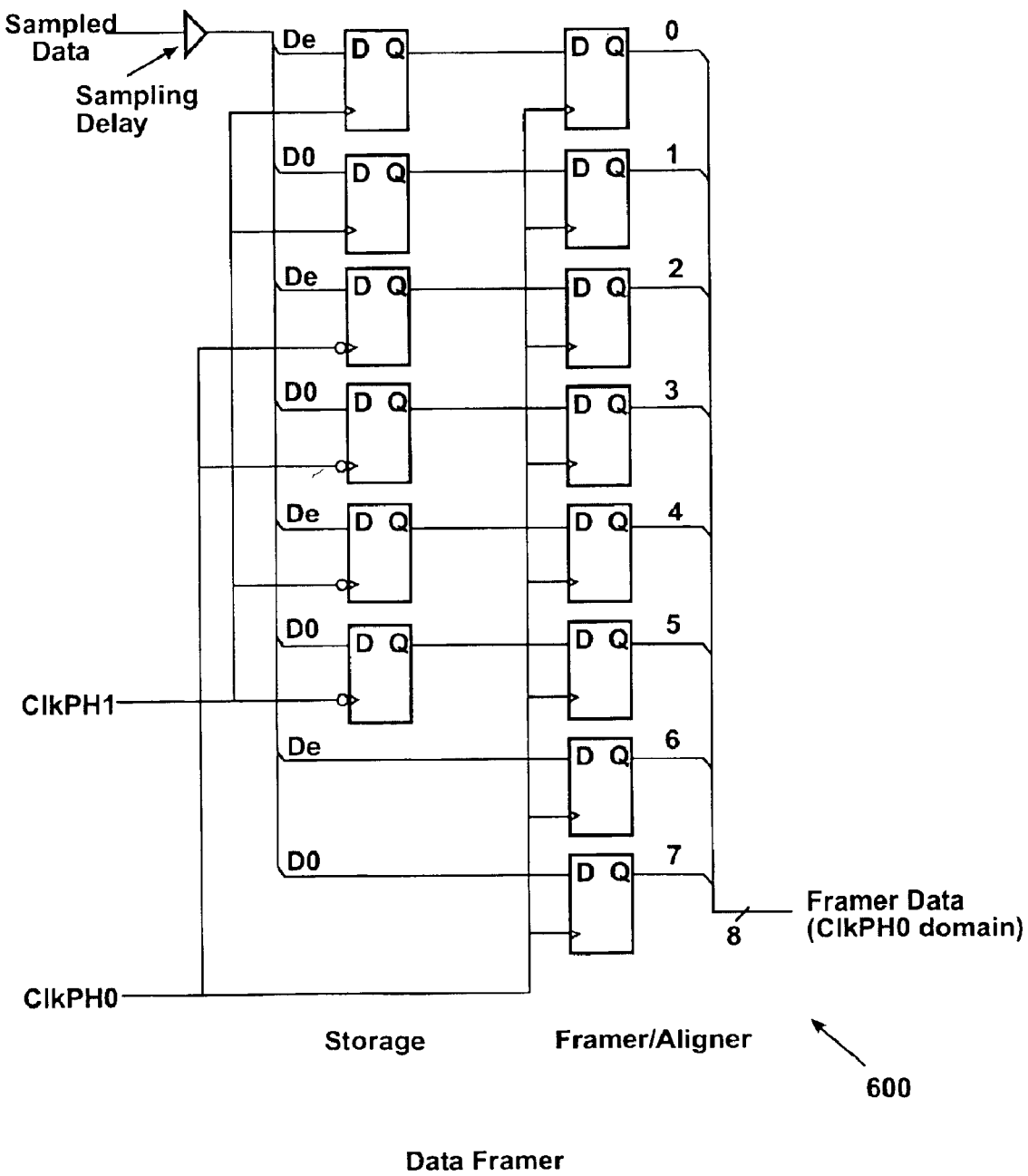
FIG. 23 is a representative diagram of a data framing scheme according to one embodiment of the invention.
Figure 24:
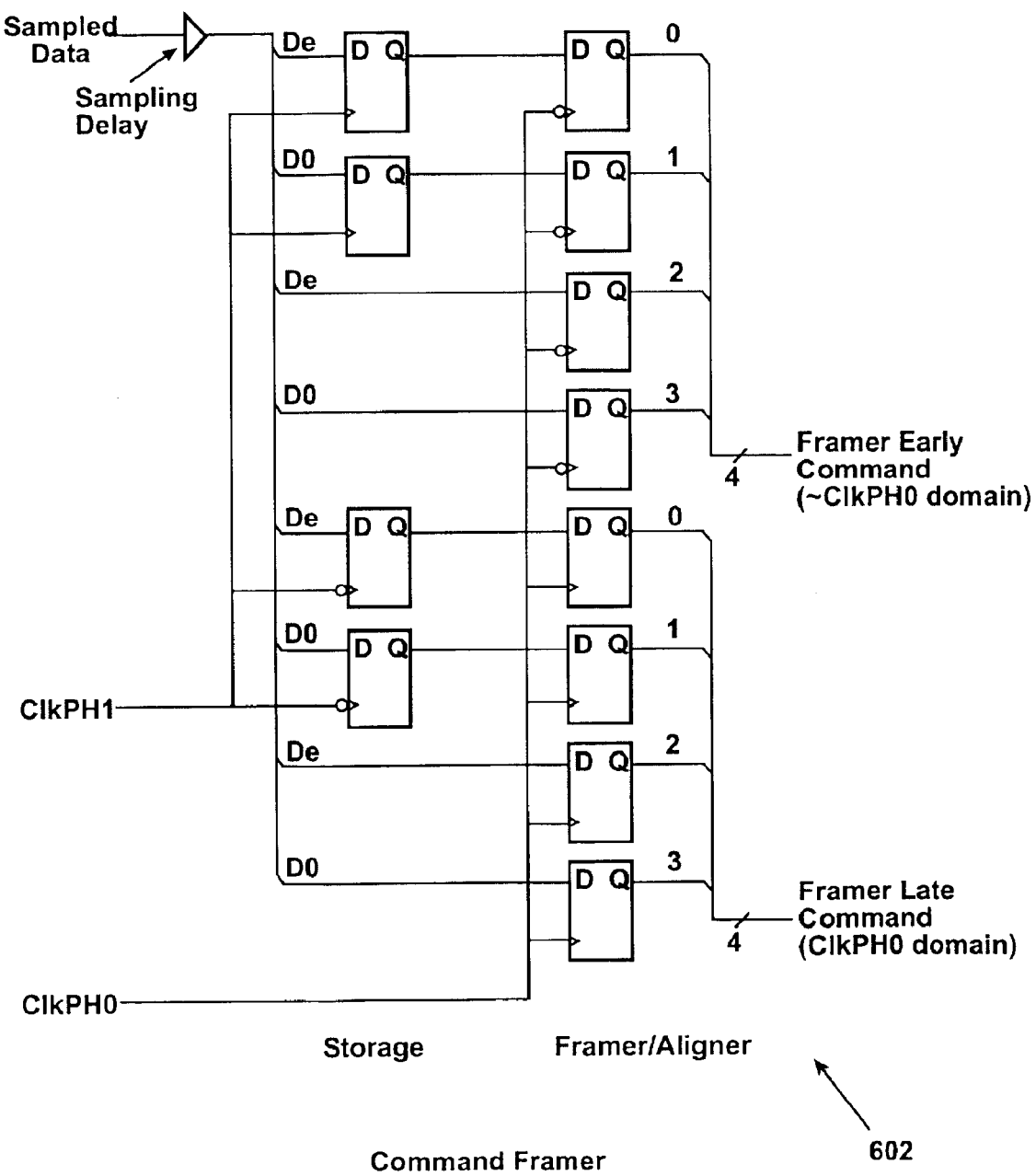
FIG. 24 is a representative diagram of a command framing scheme according to one embodiment of the invention.
Figure 25:
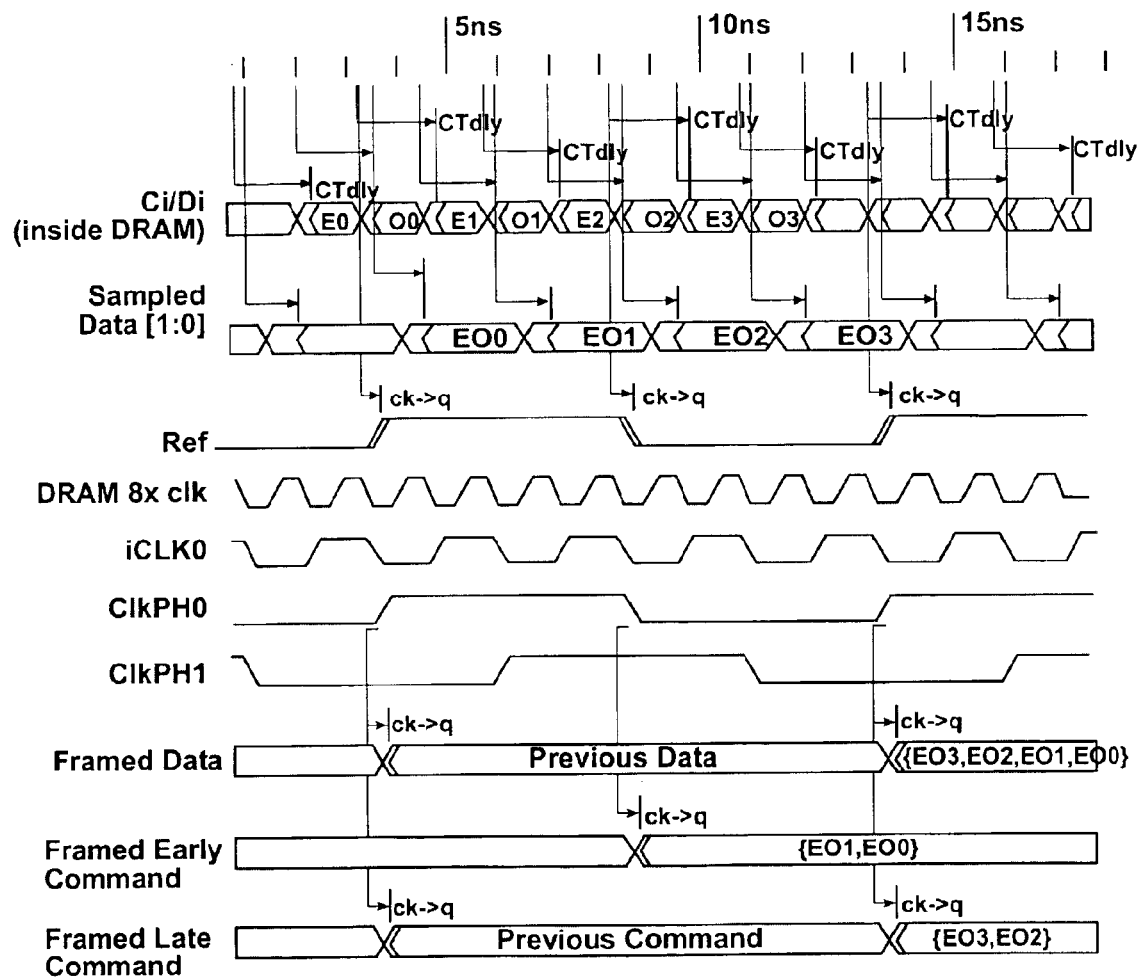
FIG. 25 is a timing diagram illustrating a relationship between clock signals, data, and command data in one embodiment of the invention.

FIG. 23 illustrates one embodiment of a data framer 600 for framing the data input Di, and FIG. 24 illustrates one embodiment of a command framer 602 for framing the command input Ci. FIG. 25 is a timing diagram illustrating the relationship between the clock signals (both original and derived), the framed data, the framed commands, and the sampled data and commands. In one embodiment, the DRAM 102 has one framer 500, 502 corresponding to each input pin. For example, if the DRAM 102 has 18 data input pins, the DRAM 102 will have 18 data framers 600 to receive the input data Di. Both the data framer 600 and the command framer 602 receive clock phases ClkPH0, ClkPH1 as inputs into their respective flip-flops. Referring to FIG. 23, sampled input data Di may be sent through a delay buffer before being input into a first group of flip-flops to ensure that sampled data, which is referenced to the sample clock Sample_CLK, is valid with respect to the derived clocks (e.g., iCLKo, ~iCLKo, ClkPHx) even if the derived clocks have some jitter with respect to the sample clock Sample_CLK.

Similarly, as shown in FIG. 24, sampled command data Ci may also be sent through a delay buffer before being sent to a first group of flip-flops 510. In this embodiment, the command framer 602 produces two output busses. As shown in FIG. 25, the command framer 602 includes an early bus synchronized to ~ClkPH0 that transports bank commands and maintenance address busses. A late bus 512 synchronized to ClkPH0 that transports read/write commands and maintenance write data. Generating the bank commands approximately one-half cycle earlier than the other commands allows the bank commands to be distributed to the designated banks without incurring an additional cycle of timing penalty. More particularly, by sending latency-critical information early in the serial bit stream, the information to be distributed is made available earlier so that it can be distributed to the banks earlier. In one embodiment, the maintenance address busses, which are originally synchronized to the ~ClkPH0 domain, are later resynchronized to the ClkPH0 domain.

Figure 26:
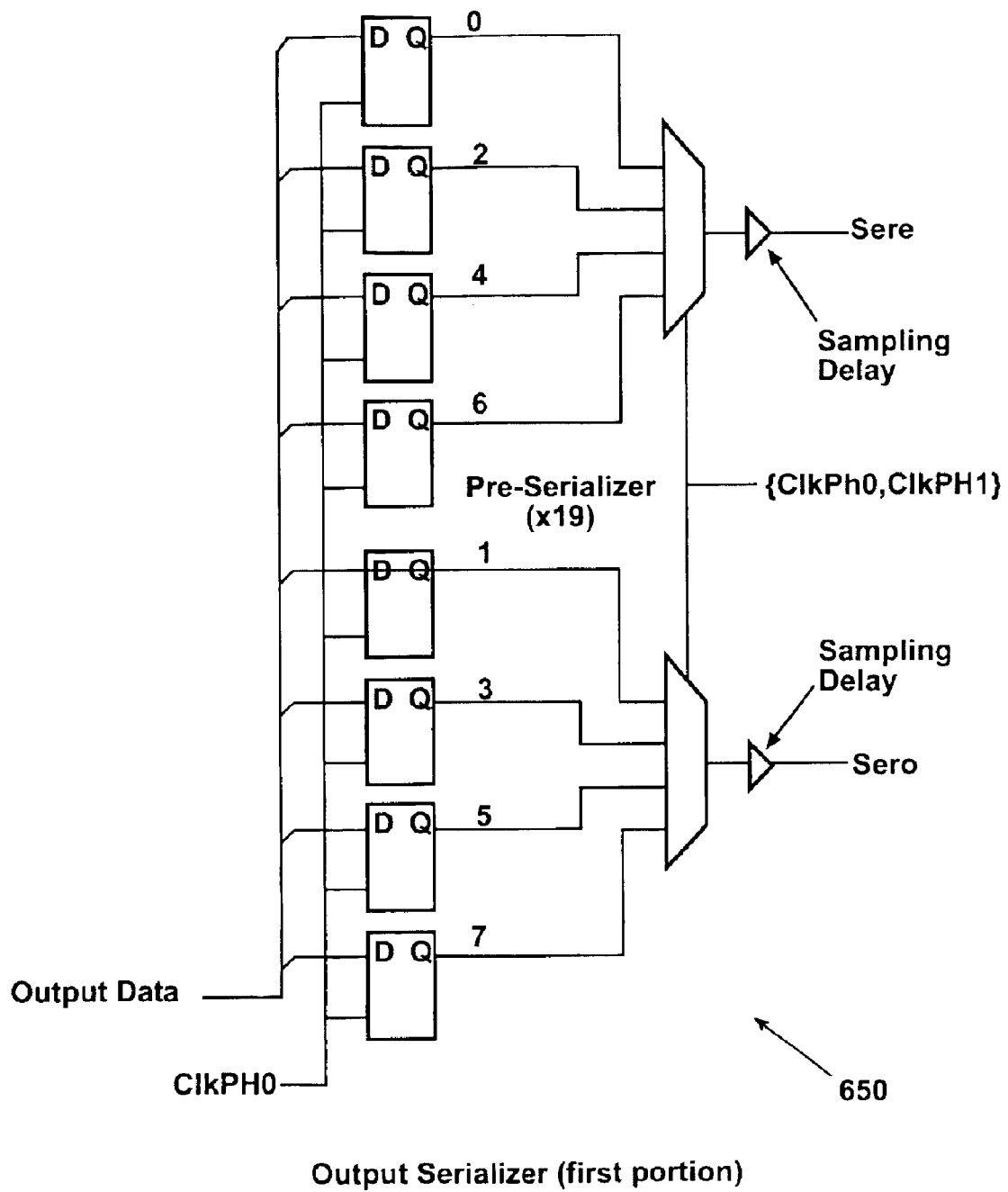
FIG. 26 is a representative diagram illustrating a first step of a serializer at the output of one embodiment of the invention.

FIG. 26 illustrates a first portion 650 of the serializer 132 (FIG. 3) according to one embodiment of the invention. The first portion 650 multiplexes the signals (in this case, eight signals) to be serialized into a pair of signals. In one embodiment, the signal pair includes an even serial signal Sere and an odd serial signal Sero, both of which run at the output clock CLKo rate. A sampling delay buffer may be inserted into the first portion to delay the even and odd serialized output signals to ensure that the data is valid for the entire half-cycle for proper sampling. In one embodiment, the first portion 650 acts as a multiplexer that uses phase signals ClkPH0 and ClkPH1 to divide an 8-bit bus.

Figure 27:
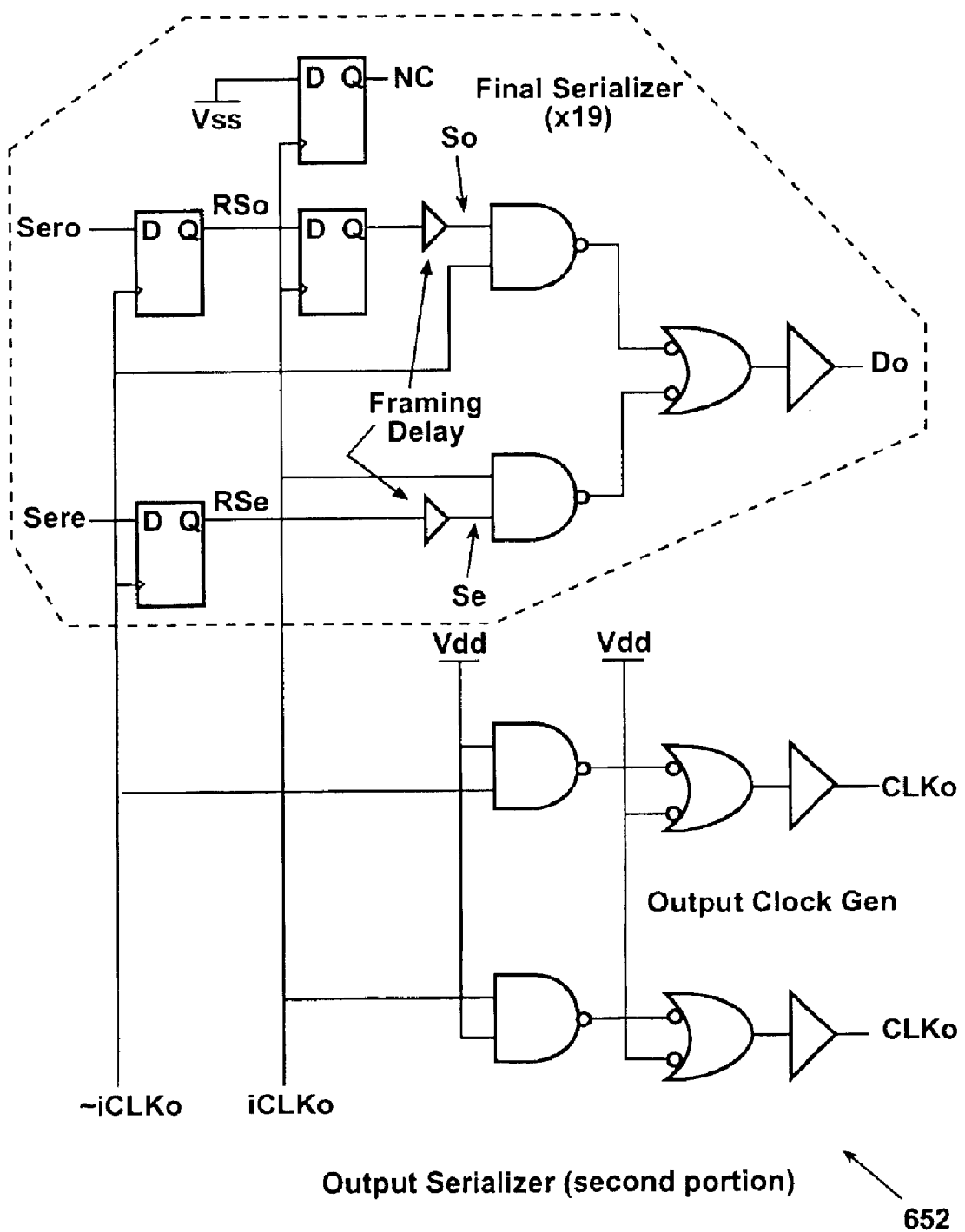
FIG. 27 is a representative diagram illustrating a second step of an output serialization scheme in one embodiment of the invention.

FIG. 27 illustrates a second portion 652 of the serializer 132 according to one embodiment of the invention. The second portion 652 receives the odd serial signal Sero and the even serial signal Sere from the first portion 650 of the serializer 132. The odd and even serial signals Sero, Sere are sent to flip-flops, resampled by the negative edge of the internal output clock iCLKo, and then resampled again into the ~CLKo domain. The second portion 652 of the serializer 132 also divides the So and Se bit pair into a single double data rate output. In one embodiment, the loading on the high-speed differential clocks are the same and the output clock path is the same as the output data path. In one embodiment, a framing delay may be added at the NAND gates that output data output Do and output clocks ~CLKo, CLKo to ensure that the output data Do is valid during the entire time each NAND gate is enabled.

Figure 28:
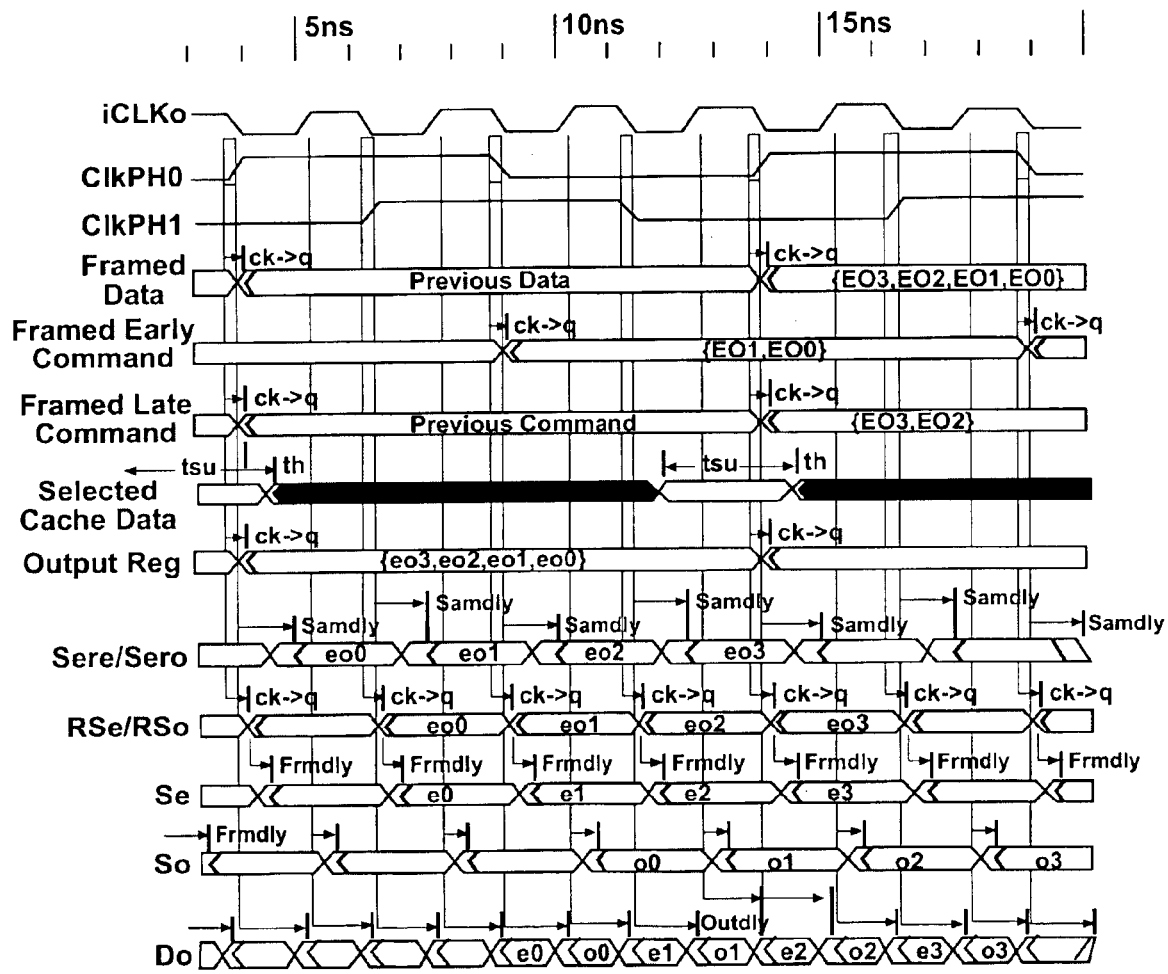
FIG. 28 is a timing diagram illustrating a relationship between clock signals, commands, and outputs in one embodiment of the invention.

FIG. 28 is a timing diagram illustrating the relationship between the internal output clock iCLKo, the phase clocks ClkPH0, ClkPH1, the framed early and late commands, the even and odd serial data, and the data generated within the second portion of the serializer.

As a result, the inventive system and method according to one embodiment of the event maintains data streaming into and out of a memory array, such as a DRAM, allowing the memory array to hide data requests while it is transferring data to the ASIC 100 in response to a prior data request. This simultaneous read/write operation allows the memory array according to one embodiment of the invention to operate at higher frequencies and to handle higher bandwidths than previously known memory arrays. The invention may be appropriate for networking applications having, for example, symmetric read/write applications, creating bus efficiencies of virtually 100% due to the decoupling between the bank commands and data transfer commands (e.g., read and write commands).

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A memory device, comprising:
   a plurality of memory arrays, each memory array having a respective single input buffer being coupled to an input data bus and having a respective single output buffer being coupled to an output data bus;
   a clock generator that generates an internal clock signal to generate at least one cycle to control timing of data transfer to and from the plurality of memory arrays;
   a controller that controls read and write operations from and to the plurality of memory arrays,
   wherein the controller receives a command word containing at least a first command and a second command and executes the first and second command on the same cycle.

2. The memory device of claim 1, wherein said at least one cycle is a transfer cycle comprising a plurality of clock cycles, and wherein the first command and the second command are executed on the same transfer cycle.

3. The memory device of claim 1, wherein the first and second commands are a read command and a write command.

4. The memory device of claim 1, wherein the first and second commands are at least two selected from the group consisting of a maintenance command, a bank command, a read command, and a write command.

5. The memory device of claim 4, wherein the bank command is selected from the group consisting of a sample command, a load command, a save command, and a do nothing command.

6. The memory device of claim 1, wherein one of said respective single input buffer and respective single output buffer comprises a cache.

7. The memory device of claim 1, wherein said respective single input buffer comprises a single write cache and said respective single output buffer comprises a single read cache.

8. The memory device of claim 7, wherein the write cache is associated with data flowing into the memory array and the read cache is associated with data flowing out of the memory array.

9. The memory device of claim 1, further comprising:
a deserializer coupled to the plurality of memory arrays and the controller and that receives at least one command selected from the group consisting of the first command, the second command, a data input, a phase input, and the input clock; and
a serializer coupled to the plurality of memory arrays and that outputs at least one output selected from the group consisting of a phase output, a data output, an output clock, and a status output.

10. A memory device, comprising:
a plurality of memory arrays, each memory array being coupled to an input data bus and an output data bus;
a clock generator that generates an internal clock signal to generate at least one cycle to control timing of data transfer to and from the plurality of memory arrays;
a controller that controls read and write operations from and to the plurality of memory arrays,
wherein the controller receives a command word containing at least a first command and a second command and executes the first and second command on the same cycle, and
wherein the command word contains a maintenance command, a first bank command, a second bank command, a read command, and a write command, and wherein the controller executes at least two of the maintenance command, the first bank command, the second bank command, the read command, and the write command on the same cycle.

11. A data transfer system, comprising:
an application specific integrated circuit (ASIC) having a memory interface; and
a memory device that communicates with the ASIC via the memory interface, the memory device having a plurality of memory arrays, each memory array having a respective input cache being coupled to an input data bus and having a respective output cache being coupled to an output data bus;
a clock generator that generates an internal clock signal having at least one clock cycle to control timing of data transfer to and from the plurality of memory arrays;
a controller that controls read and write operations from and to the plurality of memory arrays,
wherein the controller receives a command word containing at least four commands and executes first and second ones of the at least four commands in the same clock cycle, and
wherein the ASIC sends write data and the command word to and receives read data from the memory device via the memory interface.

12. The data transfer system of claim 11, wherein said at least one cycle is a transfer cycle comprising a plurality of clock cycles, and wherein the first command and the second command are executed on the same transfer cycle.

13. The data transfer system of claim 11, wherein the first and second commands are a read command and a write command.

14. The data transfer system of claim 11, wherein the first and second commands are at least two commands selected from the group consisting of a maintenance command, a bank command, a read command, and a write command.

15. The data transfer system of claim 14, wherein the bank command is one selected from the group consisting of a sample command, a load command, a save command, and a do nothing command.

16. The data transfer system of claim 11, wherein each of said plurality of memory arrays is in a respective bank that includes the input and output caches.

17. The data transfer system of claim 16, wherein the input cache is associated with data flowing into the memory array and the output cache is associated with data flowing out of the memory array.

18. The data transfer system of claim 11, wherein the memory device further comprises:
a deserializer coupled to the plurality of memory arrays and the controller and that receives at least one command selected from the group consisting of the first command, the second command, a data input, a phase input, and the input clock; and
a serializer coupled to the plurality of memory arrays and that outputs at least one output selected from the group consisting of a phase output, a data output, an output clock, and a status output.

19. The data transfer system of claim 11, wherein the memory interface converts an output from the memory device into a synchronous signal.

20. A data transfer system, comprising:
an application specific integrated circuit (ASIC) having a memory interface; and
a memory device that communicates with the ASIC via the memory interface, the memory device having a plurality of memory arrays, each memory array being coupled to an input data bus and an output data bus;
a clock generator that generates an internal clock signal having at least one clock cycle to control timing of data transfer to and from the plurality of memory arrays;
a controller that controls read and write operations from and to the plurality of memory arrays,
wherein the controller receives a command word containing at least a first command and a second command and executes the first and second command on the same clock cycle,
wherein the ASIC sends write data and the command word to and receives read data from the memory device via the memory interface,
wherein the command word contains a maintenance command, a first bank command, a second bank command, a read command, and a write command, and
wherein the controller executes at least two of the maintenance command, the first bank command, the second bank command, the read command, and the write command on the same cycle.

21. A method for accessing a memory containing a plurality of single-port memory arrays each coupled to a respective read buffer, comprising:
generating an internal clock signal having at least one cycle to control timing of data transfer to and from the plurality of single-port memory arrays;
receiving a command word containing at least a first command and a second command, one of the commands involving the transfer of data to or from a respective read buffer of at least one of the memory arrays; and
executing the first and second command on the same cycle.

22. The method of claim 21, wherein said at least one cycle is a transfer cycle comprising a plurality of clock cycles, and wherein the first command and the second command are executed on the same transfer cycle.

23. The method of claim 21, wherein the executing step executes a read command and a write command.

24. The method of claim 21, wherein the executing step executes at least two commands selected from the group consisting of a maintenance command, a bank command, a read command, and a write command.

25. The method of claim 24, wherein the bank command executed by the executing step is one selected from the group consisting of a sample command, a load command, a save command, and a do nothing command.

26. The method of claim 21 wherein each of the single-port memory arrays comprises a respective single-address-port memory array.

27. The method of claim 21 wherein each of the single-port memory arrays comprises a respective single-data-port memory array.

28. A method for accessing a memory containing a plurality of memory arrays, comprising:

generating an internal clock signal having at least one cycle to control timing of data transfer to and from the plurality of memory arrays;

receiving a command word containing at least a first command and a second command; and executing the first and second command on the same cycle, wherein the command word executed by the executing step contains a maintenance command, a first bank command, a second bank command, a read command, and a write command, and wherein the executing step executes at least two commands from the group consisting of the maintenance command, the first bank command, the second bank command, the read command, and the write command on the same cycle.

29. A memory device, comprising:

a plurality of means for storing data coupled to means for transferring data to and from said plurality of data storing means, each of the means for storing data having a respective first caching means for caching data flowing from the data storing means and a second caching means for caching data flowing to the data storing means, the respective first and second caching means each including a respective single cache;

means for generating at least one cycle to control timing of data transfer to and from the plurality of data storing means; and means for controlling read and write operations from and to the plurality of data storing means, wherein the controlling means receives a command word containing at least a first command and a second command and executes the first and second command on the same cycle.

* * * * *